(12) United States Patent
Suzuki

(10) Patent No.: US 7,972,949 B2
(45) Date of Patent: Jul. 5, 2011

(54) ELECTRONIC COMPONENT AND DISPLAY DEVICE AND A METHOD OF MANUFACTURING THE SAME

(75) Inventor: Seiji Suzuki, Kawasaki (JP)

(73) Assignee: NEC Corporation, Tokyo (JP)

(*) Notice: Subject to any disclaimer, the term of this patent is extended or adjusted under 35 U.S.C. 154(b) by 268 days.

(21) Appl. No.: 12/201,391

(22) Filed: Aug. 29, 2008

(65) Prior Publication Data

US 2009/0227057 A1    Sep. 10, 2009

(30) Foreign Application Priority Data

Aug. 31, 2007    (JP) ................... 2007-226358

(51) Int. Cl.
*H01L 21/22* (2006.01)
*H01L 21/38* (2006.01)
*G03G 17/04* (2006.01)

(52) U.S. Cl. ............... 438/551; 430/33; 257/E21.023

(58) Field of Classification Search .......... 438/34, 438/551; 430/33
See application file for complete search history.

(56) References Cited

U.S. PATENT DOCUMENTS 7,148,090 B2    12/2006    Chapman

FOREIGN PATENT DOCUMENTS

| JP | 2000-131719 | 5/2000 |
|---|---|---|
| JP | 3236266 | 9/2001 |
| JP | 3415602 | 4/2003 |
| JP | 3616584 | 11/2004 |
| JP | 2005-159294 | 6/2005 |
| JP | 3730002 | 10/2005 |
| JP | 3756363 | 1/2006 |
| JP | 2006-512757 | 4/2006 |
| JP | 2006-124546 | 5/2006 |

*Primary Examiner* — W. David Coleman
(74) *Attorney, Agent, or Firm* — Young & Thompson

(57) ABSTRACT

An electronic component or display device of the present invention can be provided by using a following pattern formation method. On a substrate treated with a first etching with a first resist pattern as a first mask, a second resist pattern is transfer-printed on the first resist patterns so as to partially overlap with the first resist pattern and partially extended from the first resist pattern. And then a second etching is performed by using the first resist pattern and the second resist pattern as a second mask. The first resist pattern and the second resist pattern are used for forming wirings and/or terminals, and the extended portion of the second resist pattern is used to make the wirings to have a cross section of a stair-like edge shape.

20 Claims, 23 Drawing Sheets

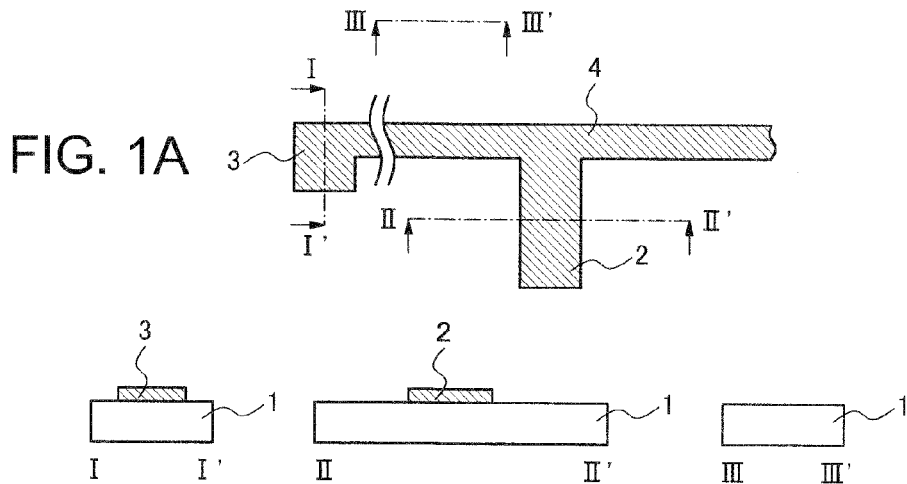
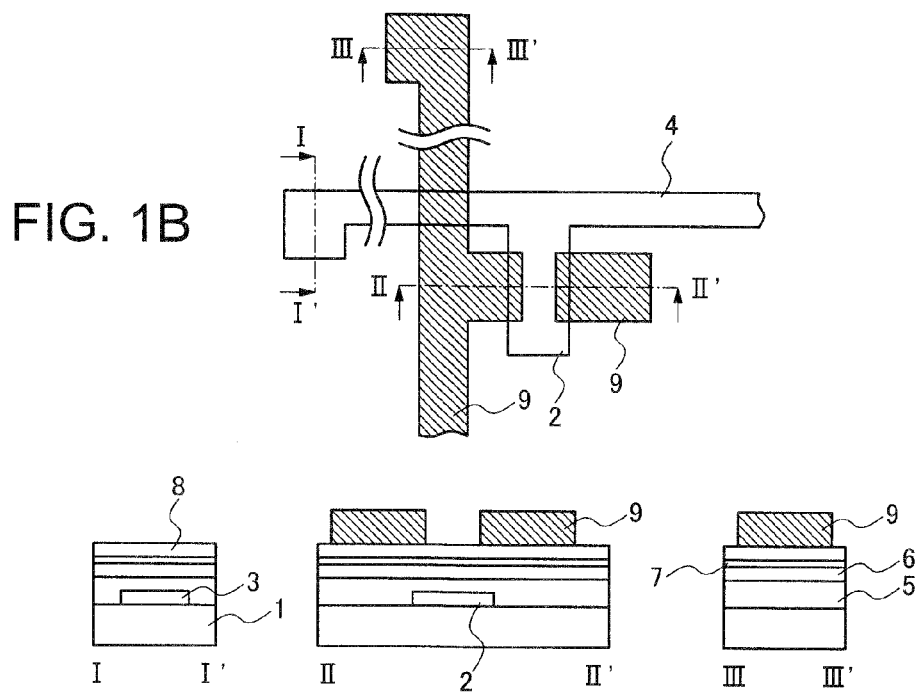

FIG. 1C-I  FIG. 1C-II  FIG. 1C-III

FIG. 1D-I  FIG. 1D-II  FIG. 1D-III

FIG. 1E-I  FIG. 1E-II  FIG. 1E-III

FIG. 1F-I  FIG. 1F-II  FIG. 1F-III

FIG. 1G-I  FIG. 1G-II  FIG. 1G-III

FIG. 2A-I  FIG. 2A-II  FIG. 2A-III  FIG. 2A-IV

FIG. 2B-I  FIG. 2B-II  FIG. 2B-III  FIG. 2B-IV

FIG. 2C-I   FIG. 2C-II   FIG. 2C-III   FIG. 2C-IV

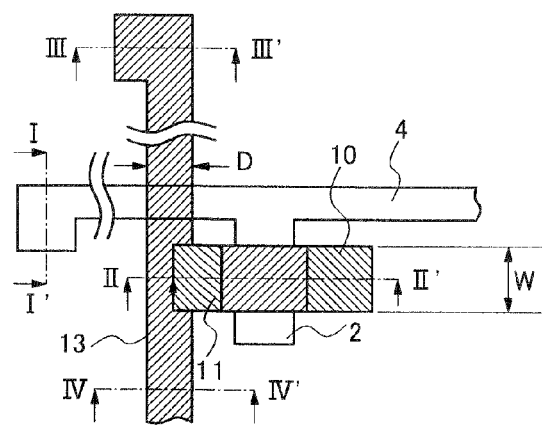
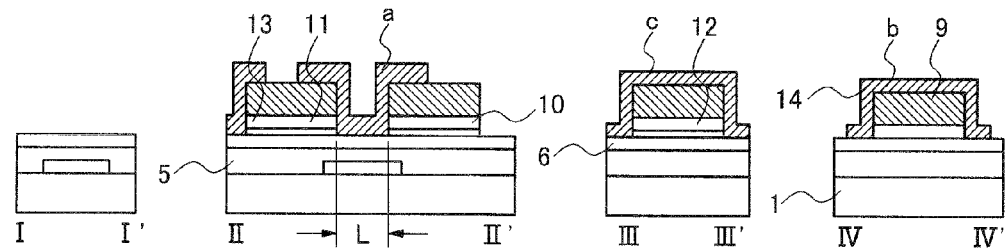
FIG. 6A-I  FIG. 6A-II  FIG. 6A-III  FIG. 6A-IV

FIG. 6B
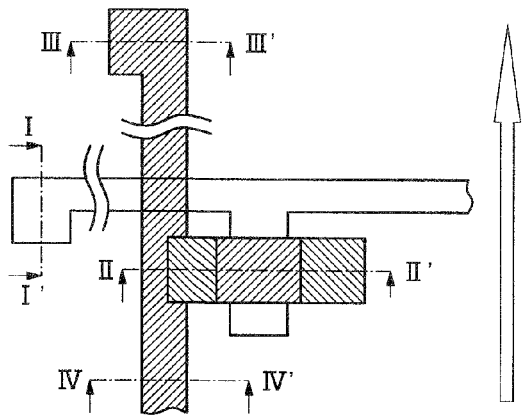
 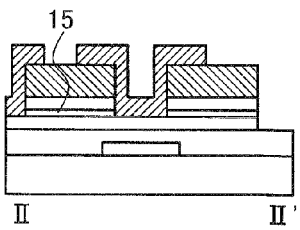 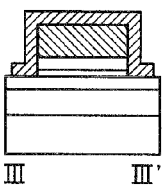 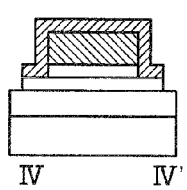
FIG. 6B-I  FIG. 6B-II  FIG. 6B-III  FIG. 6B-IV
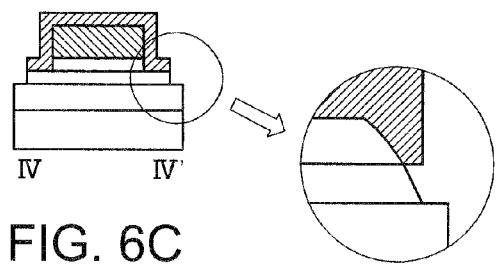
FIG. 6C
FIG. 6C-IV

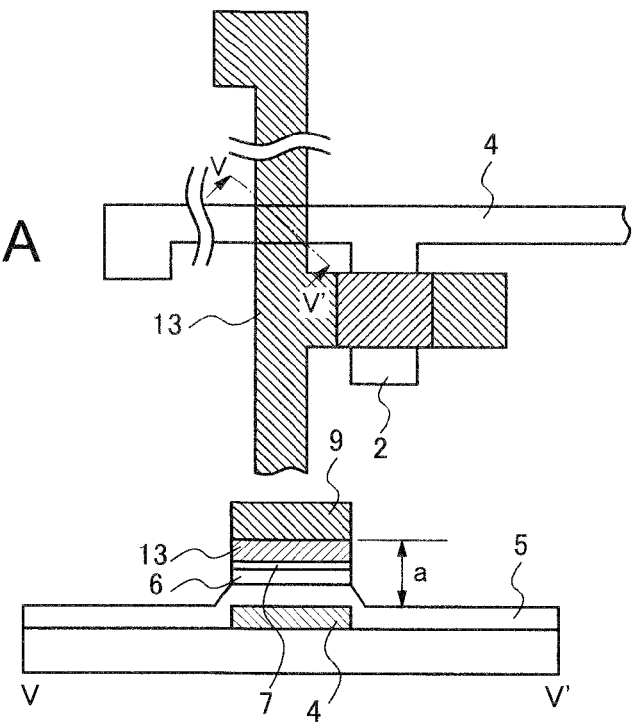
FIG. 7A
FIG. 7A -V
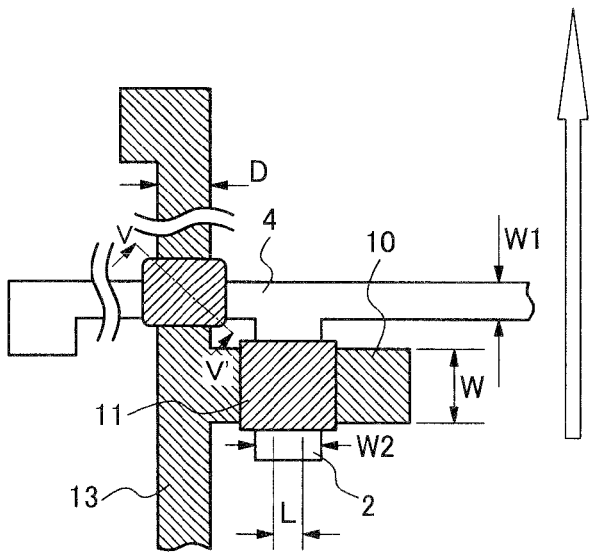
FIG. 7B
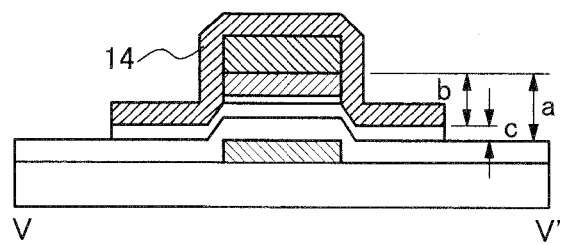
FIG. 7B -V

ELECTRONIC COMPONENT AND DISPLAY DEVICE AND A METHOD OF MANUFACTURING THE SAME

INCORPORATION BY REFERENCE

This application is based upon and claims the benefit of priority from Japanese Patent Application No. 2007-226358, filed on Aug. 31, 2007, the disclosure of which is incorporated herein in its entirety by reference.

BACKGROUND OF THE INVENTION

1. Technical Field

The present invention relates to an electronic component formed by using a pattern formation method wherein the second resist pattern is formed on the first resist pattern by a transfer-printing and in particular, relates to a display device having a thin film transistor (TFT) formed by using the above-mentioned pattern formation method.

2. Background Art

A method of manufacturing such an electronic component as semiconductor device, in particular a method of manufacturing the TFT has been supported by such technological development as a film-forming technology, a photolithography technique and an etching technology. In the TFT manufacturing process, its permanent problem is a development of means for improving its productivity, performance and yield.

Means for solving the above-mentioned problem is to combine a resist mask formation and an etching efficiently.

A concept of the above mentioned efficient combination is that forming the resist pattern on the film needed for composing TFT, etching the film by using this resist pattern as a first mask, and further etching the film after transforming the resist pattern in some way to be used as a second mask.

Thus, by etching the film for the TFT before and after the step of transforming the resist pattern, respectively, different patterns are formed on the film. By designing such processes, the number of photolithography steps such as the resist coating, the exposure and the development can be reduced.

In recent years, in order to reduce the number of the photolithography steps, it is also considered that the resist pattern is formed directly on a substrate by using a transfer-printing method. According to this transfer-printing method, because the resist pattern can be formed by only printing technology, those needed steps such as resist coating step, exposure step and development step can be omitted. Therefore, the productivity can be improved.

First, well-known examples using photolithography technique will be described in the range of inventor's knowledge. In order to understand the examples easily, they are classified into three technological groups as follows.

A first related art technology is to transform a resist by dissolving it. This technology is called a reflow technology. There are two methods belonging to this reflow technology. The one is resorting to heat, and the other is resorting to chemical solution or its vapor.

A second related art is a technology in which a resist is subjected to volume expansion, that is, the resist is transformed by swelling it. In fact, such swelling technology is called a silylization.

A third related art is a technology in which a part of resist is removed, and then a remaining resist is transformed. This method uses a controlled exposure mask having three or more stages of light transmission factors. By exposing a resist to light through this mask, at least three different film thicknesses are simultaneously provided into the resist such that a thick portion, a thin portion and non-resist portion are formed on a substrate, and then the thin portion is appropriately removed in the succeeding step. As to the removing method, either a solvent method using a development process or a dry method using an ashing process is available.

A related art will be described in detail according to the above-mentioned technological classification by referring processes of forming such as a drain electrode, a source electrode, a data pad (terminal electrode), a wiring pattern, and a channel.

Here, the above-mentioned first related art is described by dividing it into a first conventional example and a second conventional example.

The first conventional example ([patent document 1: Japanese Patent Application Laid-Open No. 2000-131719]) belongs to a technology which dissolute and transform the resist pattern relying on heat treatment.

FIG. 11A to FIG. 11C are cross sectional views each showing a manufacturing step of an inverted-stagger type TFT for the above described first conventional example. In the following, the description is made in order of steps.

First, by patterning a metal film formed on the insulating glass substrate 101, a gate pattern that includes a gate line 102, a gate electrode 103 and a gate pad 104 is formed. The metal film may be either a single layer or a laminated state if needed.

Next, a gate insulation film 105, a semiconductor layer 106 such as an amorphous silicon film, a contact layer 107 such as an n-type amorphous silicon film, and a metal film are laminated to cover the gate pattern in that order. In a patterning step, the metal film will be patterned so as to form a data line 108, a drain electrode 109, a source electrode 110 and a data pad 111 as follows.

As shown in FIG. 11A, after arranging a pre-transform resist pattern 112 on a required area of the metal layer, the metal layer is etched to form the data pattern that includes the data line 108, the drain electrode 109, the source electrode 110 and the data pad 111.

After that, as shown in FIG. 11B, by reflowing the pre-transform resist pattern 112 with heat treatment, a post-transform resist pattern 113 is obtained. And the contact layer 107 and the semiconductor layer 106 are etched and selectively removed from the substrate by using the post-transform resist pattern 113 as a mask.

As shown in FIG. 11C, after removing the post-transform resist pattern 113 from the substrate, a channel region of the TFT is formed by removing the part of the contact layer 107 and the semiconductor layer 106 by using the data pattern as a mask.

Hereinafter, an insulating film which is not being illustrated is laminated on the substrate shown in FIG. 11C. And contact holes (not shown) are provided on corresponding portions of a gate pad 104, a data pad 111 and a drain electrode 109 to be connected to an upper layer film formed on those portions.

After that, transparent electrodes of indium tin oxide (ITO) or the like are formed on the substrate to form pixel electrodes electrically connected with drain electrodes and protection layers for protecting a gate pad and a data pad, and then a TFT substrate is brought to completion.

The second conventional example ([patent document 2: Japanese Patent Publication No. 3616584]) is a technology which transforms a resist film by a reflow as well as the first conventional example. However, in the second conventional example, the resist is transformed by either dipping it into a chemical solution having the functions to dissolve or revealing it to the chemical solution vapor, and thus it is different from the first conventional example resorting to the heat treatment A detailed manufacturing method of the second conventional example will be described referring to FIG. 11 which is used in the first conventional example so that a point of difference with the first conventional example may become clear. By using a pre-transform resist pattern 112 as a mask, a metal layer turned to be the data pattern is etched together with a contact layer 107. After that, the pre-transform resist pattern 112 is reflowed by either dipping it to a chemical solution having the functions to dissolve the resist or revealing it to the chemical solution vapor to form a post-transform resist pattern 113. And a semiconductor layer 106 is removed by using the post-transform resist pattern 113 as a mask.

In this conventional example, other technology is also disclosed such that a deterioration layer formed on the resist surface is removed prior to reflowing the resist. Removal processing methods for the deterioration layer are either plasma processing or ultra violet (UV) ozone processing. As to the plasma processing, it is processed based on oxygen ($O_2$) gas system or the fluoric gas system, and various gas and its assortment are disclosed.

There is another conventional example ([patent document 3: Japanese Patent Publication No. 3415602]) which relates about the end-point control of the reflow as an application of the second conventional example. This conventional example discloses a method to hold a reflowed resist at the barrier portion to which the resist encounters first. This barrier portion is structural unevenness, and its detailed structure is also disclosed.

Next, such transforming technology for the resist classified into the second related art will be described as a third conventional example ([patent document 4: Japanese Patent Publication No. 3236266]) where the resist is subjected to a volume expansion, that is, the resist is swollen by the solution.

The third conventional example will be described below with referring to FIG. 12A, FIG. 12B and FIG. 12C. An amorphous silicon film 202 and an n-type amorphous silicon film 203 are laminated on the insulating substrate 201, and a pre-swollen pattern 204 is further formed. The pattern of the n-type amorphous silicon film 203 is formed by using the pre-swollen pattern 204 as a mask (FIG. 12A).

Next, by dipping the pre-swollen pattern 204 into an organic silane solution, or by revealing the pre-swollen pattern 204 to the organic silane vapor, the pre-swollen pattern 204 is silylized and expanded in its volume to cause a transformation thereof. By this operation, an isolated pre-swollen resist 204 is united each other, and thus a post-swollen resist pattern 205 is formed (FIG. 12B).

By etching an amorphous silicon film 202 using the post-swollen resist pattern 205 as a mask, an island 206 is formed (FIG. 12C).

Next, other technologies of partially removing a resist and transform it, which is classified into the third related art will be described as the fourth conventional example and the fifth conventional example, respectively.

The fourth conventional example ([patent document 5: Japanese Patent Publication No. 3756363]) uses an exposure mask which is available for the light transmittance in three stages. By exposing a resist to light through the exposure mask, at least three different film thicknesses are simultaneously provided into the resist such that a thick portion, a thin portion and non-resist portion are formed on a substrate. A lower layer film is etched by using the resist pattern as a mask, and after that, the resist pattern is transformed by removing a thin portion of it, and then the lower layer film is further etched by using the post-transform resist pattern as a mask.

Exposure processing will be described referring to FIG. 13. A resist film 302 is coated on the substrate 301 provided with a film, and the resist film is exposed to light 304 of wavelength sensitive to the resist film by using a slit mask 303 including the slit part 305.

In the slit part 305 of the slit mask 303, a minute pattern is arranged such that the pattern is smaller than the resolution limit determined from the characteristic of the resist, the exposure wavelength and the exposure lens performance or the like. Therefore, the transmitted light volume through the slit part 305 would be the light quantity corresponding to the intermediate light quantity between a shaded part and a non-shaded part. By exposing the resist film with such mask, an exposed part 306 and an unexposed part 307 can be produced in the resist film (FIG. 13A). By developing the above-described exposed resist film, as shown in FIG. 13B, a resist pattern having a thick portion, thin(intermediate) portion and non-resist portion is formed on the substrate at one time.

Although an example of an exposure mask using a slit mask has been described, it is also disclosed about a mask using a latticed mask instead of a slit mask, and a mask with a semitransparent film instead of a minute pattern mask having smaller size than the exposure resolution.

Next, by referring to FIG. 14A, FIG. 14B and FIG. 14C, a method of manufacturing a TFT substrate using this conventional example will be described.

A gate electrode 311 is formed on the insulating substrate 310, and a gate insulation film 312, a semiconductor film 313, a contact film 314 and a metal film 315 are laminated successively on it. After that, the resist is exposed by using an exposure mask which is available for the light transmittance in three stages as described above, a resist pattern having a thick portion, thin portion and non-resist portion is formed on the substrate at one time. And a metal layer 315 is etched by using this resist pattern as a mask (FIG. 14A).

Next, by etching the contact film 314 and semiconductor film 313, the contact layer pattern 317 and the semiconductor pattern 318 are formed (FIG. 14B).

Next, a resist film 316 is transformed by removing the resist film using ashing process by about thickness corresponding to the thin portion thereof or more. In this ashing removal process, either a plasma gas or a microwave is used. A metal film is etched again by using the transformed resist pattern as a mask, and thus a source electrode 319 and a drain electrode 320 are formed. The part of the contact layer pattern 317 and the semiconductor pattern 318 is further etched to form a channel portion of a transistor is formed (FIG. 14C). Hereinafter, an insulating film and pixel electrodes are formed to complete the TFT, wherein the insulating film is aimed at protecting transistors and functioning as an interlayer insulation film separating wiring and the pixel electrodes.

The fifth conventional example ([patent document 6: Japanese Patent Application Laid-Open No. 2005-159294]) is technology which transforms the resist pattern using development. Difference between this case and the fourth conventional example will be described referring to FIG. 14 used by a description of an example of the fourth conventional example. By forming the resist film 316 in a similar manner as in the fourth conventional example, and removing a metal layer 315 with the resist film 316 as a mask (FIG. 14A), and etching the contact film 314 and the semiconductor film 313, the contact layer pattern 317 and the semiconductor pattern 318 are formed (FIG. 14B).

Next, if needed, the removing process is applied to the surface of the resist film 316 to remove a deposit layer or a deterioration layer formed thereon. Either a wet method or a dry method is employed for this process; the wet method uses a chemical solution which dissolves a resist such as a developing solution and a stripping solution, while the dry method includes ultra violet (UV)/ozone ($O_3$) process and an ashing process. And then, a transformed resist is formed by using the development process wherein a thin portion of the resist is removed to reveal the substrate.

Difference between the fourth conventional example and the fifth conventional example is an elimination method for the resist pattern. That is, the former is a method using an ashing method, and the latter is a method using development method.

A metal film is etched again by using the transformed resist pattern as a mask, and thus a source electrode 319 and a drain electrode 320 are separated. The part of the contact layer film 314 and the semiconductor film 313 is etched and a channel portion is formed (FIG. 14C). Hereinafter, an insulating film and pixel electrodes are provided to complete the TFT, wherein the insulating film is aimed at protecting transistors and functioning as an interlayer insulation film separating wiring and the pixel electrodes.

In the above mentioned description, although well-known techniques classified into the first to third related arts are described as the first to fifth conventional examples, a developed technology from the second conventional example will be described below as the sixth conventional example. This conventional example is disclosed in the patent document 2 as well as the second conventional example.

A common technical issue to the first and second conventional examples described in the first related art is that even unnecessary portions of the resist are reflowed.

The unnecessary portions 114 are designated in FIG. 11. The sixth conventional example indicates a technology to reduce these unnecessary portions.

This conventional example will be described referring to FIG. 15A and FIG. 15B. Upper side of FIG. 15A and FIG. 15B are plan views, and FIG. 15A-X and FIG. 15B-X indicated on the underside are cross sectional views along X-X' lines of FIG. 15A and FIG. 15B, respectively. Difference between the sixth conventional example and the second conventional example is that the resist pattern before the reflow process is formed by using an exposure mask which is available for the light transmittance in three stages as described in the fourth and fifth conventional examples.

According to FIG. 15A and FIG. 15A-X, the resist portion which should be transformed and reflowed adjacent to a channel portion 401 is made thick, and its surrounding area is made thin. That is, by making thin thickness of the resist thickness at the portion adjacent to unwanted reflow area, the reflow area toward that unwanted reflow area is made small (FIG. 15B and FIG. 15B-X indicate the stage after the reflow process).

In the foregoing, well-known examples which efficiently combined a formation and an etching of the resist mask has been described in detail taking the examples of forming a source electrode, a drain electrode and a channel.

Another well-known example which efficiently combined the formation and the etching of the resist mask will be further described. This technology relates to giving a forward tapered shape to a wiring edge.

First, there is a technology in which the forward tapered shapes are provided at wiring edges by reflowing a resist by a solvent. This technology is disclosed in the patent document 2 as well as the second conventional example. This technology will be described by referring to FIG. 16.

A single alloy layer film 502 of aluminum(Al) and copper (Cu) is formed on the insulating substrate 501, and a resist is applied on it. Next, the resist pattern 503 is formed using photolithography (FIG. 16A).

Next, a part of the single alloy layer film 502 is etched by using the resist pattern 503 as a mask. After that, the resist pattern is expanded to form a post-reflow resist pattern 504 (FIG. 16B) by reflowing the resist pattern by an organic solvent.

Next, the single alloy layer film 502 is etched by using the post-reflow resist pattern 504 as a mask (FIG. 16C).

By the foregoing processing, a wiring edge can be made the forward tapered shape like the staircase. In this patent document 2, it is further disclosed the case that two or more kinds of metal films are laminated for the wiring.

Next, a technology for providing the forward tapered shapes to wiring edges will be described, in which a resist are subjected to the volume expansion. This technology is disclosed in the above-stated patent document 4 as well as the third conventional example, and it will be described referring to FIG. 17.

A single Al—Cu alloy layer film 602 is formed on the insulating substrate 601, and a resist is applied on it. Next, the resist pattern 603 is formed using photolithography (FIG. 17A).

Next, after etching the part of the single alloy layer film 602 by using the resist pattern 603 as a mask, the resist pattern 603 is revealed to an organic silane gas to swell it, and thus a post-swollen resist pattern 604 is formed (FIG. 17B).

Next, the single alloy layer film 602 is etched by using the post-swollen resist pattern 604 as a mask (FIG. 17C).

By using the above mentioned processing, a wiring edge can be made to have a forward tapered shape like a staircase.

In the foregoing, known examples for manufacturing the TFT by efficiently combining a formation and an etching for a resist mask has been described. In the foregoing description, two processes are separately described such that one is the process of forming a source electrode, a drain electrode and a channel, and the other is a process for providing the forward tapered shapes to a wiring edge.

In the following description, a well-known example relating to a pattern transfer-printing will be mainly described.

As to a method to arrange the resist pattern on a substrate by a transfer-printing, there is a relief reversal offset printing.

As the seventh conventional example ([patent document 7: Japanese Patent Publication No. 3730002]), a pattern forming method by the relief reversal offset printing will be described. According to this conventional example, although it mainly relates to production of a color filter, the limitation of its use is not mentioned.

FIG. 18 shows the seventh conventional example and FIG. 18A indicates a movement of the whole apparatus, FIG. 18B indicates a step image pull-out and FIG. 18C indicates a transfer step, respectively.

1) A blanket cylinder 701 wound with a silicon sheet (not shown) is installed in the movable frame 705. The movable frame 705 moves along a fixed frame 704 equipped with a glass substrate stage 702 and a printing stamp stage 703. A glass substrate 706 is located on the glass substrate stage 702 and stamp 707 is located on the printing stamp stage 703 (FIG. 18A).

2) A predetermined amount of the ink is dropped on the silicon sheet wound around the blanket cylinder 701 using a dispenser 708.

3) The blade 709 and the ink are contacted by rotating the blanket cylinder 701 so that the ink is made uniform thickness at the surface of the silicon sheet.

4) The stamp 707 is pressed to an ink film 710 on the silicon sheet (blanket), and an ink 711 in a portion corresponding to a stamp portion is removed from the blanket (FIG. 18B).

5) An ink film 712 with the desired shape that remained in the blanket is transfer-printed on the glass substrate 706 (FIG. 18C). In this way, an ink with the desired shape is transfer-printed on the glass substrate.

According to this conventional example, the silicon is disclosed as the material of the sheet (blanket) wound around the blanket cylinder.

In a following eighth conventional example ([patent document 8: Japanese Patent Application Laid-Open No. 2006-124546]), such technology will be described that a transfer-printing technology with precise pattern accuracy and resist material (ink) available for the relief reversal offset printing indicated by the seventh conventional example.

Resist in the eighth conventional example includes resin soluble to an organic solvent (A), and an organic solvent (B).

As to the resin, an alkali-soluble resin such as novolac resin, acrylic resin and those mixtures are disclosed.

As an example of the organic solvent, isopropyl alcohol, propyl alcohol and ethyl alcohol are disclosed with no smaller than 60% of gross weight % (hereinafter, "wt %"). It is further disclosed that it is able to mix with propylene glycol monomethyl ether acetate.

In order to perform the transfer-printing certainly, it is desirable that a transfer pattern should include a large number of lines along vertical or slanting directions but a small number of lines along the horizontal direction. This is because a transfer-printing tends to be inferior to a line of a horizontal direction. For example, in a case of a grid pattern, its pattern is transfer-printed such that the grid is rotated to have a shape of rhombus.

It is disclosed to heat and dry the resist under 100-150° C. for 1-15 minutes after the transfer-printing. As resist material, it is disclosed to be able to adopt a photo-curing mold material and/or a thermal hardening mold material.

According to this conventional example, by using a relief reversal offset printing with the above-mentioned resist, it is disclosed to form the gate pattern width of 50 μm for TFT on the substrate. On the substrate, an upper layer film of Mo (molybdenum) and a lower layer film of Al—Nd (neodymium) alloy are formed in advance.

Next, as the ninth conventional example ([patent document 9: a Published Japanese translation of PCT application No. 2006-512757 bulletins]), a pattern forming technology will be described wherein a resist pattern having three region of a thick portion, thin portion and non-resist portion is formed on the substrate by forming the second resist pattern on the first resist pattern, like in the case of the second related art.

A method to form a source electrode, a drain electrode and a channel will be described referring to FIG. 19.

First, a gate insulation film 802, semiconductor film 803, a contact layer 804 and an upper layer metal film 805 are formed successively on the insulating substrate 801 provided with a gate pattern. After that, the first resist pattern 806 is arranged on the insulating substrate (FIG. 19A).

Next, the second resist pattern 807 is arranged so that at least part of the first resist pattern 806 and a channel portion is covered with it. By using the first resist pattern 806 and the second resist pattern 807 as a mask, an upper layer metal film 805, a contact film 804 and semiconductor film 803 are removed by the first etching step to expose a gate insulation film 802 (FIG. 19B). At that time, the upper layer metal film/the contact film/the semiconductor film remains in the channel portion. That is, although the island peripheral pattern is formed, a source electrode and a drain electrode are not separated.

Next, the second resist 807 of the channel portion is removed (FIG. 19C).

Next, by the second etching step, the part of the upper layer metal film 805, the contact film 804 and the semiconductor film 803 of the channel portion is removed, and the channel portion is formed (FIG. 19D).

In this way, the ninth conventional example is a method to form a channel (by removing the part of the semiconductor film from an upper layer film) after removing the resist arranged on the channel portion.

However, a related art described by a background art has several issues and problems. Conventional problems will be described below by illustrating the example of a liquid crystal display (LCD) device.

First, the first related art that it makes reflow a resist, that is, a problem of the first conventional example and the second conventional example will be described.

The first problem is as follows:

A resist before transformation is arranged on the substrate with the shape similar to the data pattern, that is, almost the same shape of a source electrode, a drain electrode and data wiring. A film of a lower layer is etched by using the resist pattern before the transformation as a mask, and the data pattern is formed.

Next, the resist pattern before the transformation is transformed by the reflowing process.

The purpose of the reflowing of the resist pattern is to cover a channel portion with the resist. To this end, the needed reflow length is at least ½ of a channel width.

A channel width of usual amorphous silicon TFT is about approximately 6 μm in spite of the fineness of the LCD panel. Accordingly, the needed reflow distance will be at least 3 μm.

The resist pattern before a reflow covers the entire data pattern. Therefore, by the above-mentioned reflow processing, a resist will reflow and spread not only in a channel portion but also on all area of the source electrode, a drain electrode and data wiring. Needless to say, its needed distance is also at least 3 μm.

When the semiconductor film is etched by using the resist pattern as a mask after such reflow, pattern formation will be performed in such a manner that semiconductor film is rimming around the source electrode, the drain electrode and the data wiring. (It has been expressed by a description of a background art with "unnecessary portion" and it has been described.) Thus, semiconductor film rimming the data pattern affects unwanted influence and as a result, causes a decline of the display quality of the LCD device.

One of the reasons is that it relates to semiconductor film for which it is left so that a data wiring may be rimmed. It is effective in the meaning that the wiring is tapered due to semiconductor film left around the data wiring. However, the problem is that its width is wider than about ½ of the channel width.

For example, it is verified by using a VGA panel classified into the rough fineness class in the general LCD panel. That is, the size of one pixel surrounded with gate wiring and data wiring is about 100 μm along the gate wiring and about 300 μm along the data wiring. The width of the gate wiring is about 25 μm and the width of the data wiring is about 8 μm. The distance between the data wiring and the pixel electrode needs about more than 5 μm when taking the yield or the like into consideration.

From the foregoing, the width of the pixel electrode which can be formed between adjacent data wirings is about approximately 82 μm in case of not using the reflow process. On the other hand, with reflowing, the width of the pixel electrode will be 76 μm. Therefore, with reflowing, only an aperture ratio of 76/82=92.7% can be obtained compared with a case without reflow. The difference in the aperture ratios influences panel brightness directly.

Although more LCD panels become high-definition in these days, the higher the fineness is, the more remarkable the above-mentioned problem becomes, and decreasing rate of LCD panel brightness will be increased in more. This is because a channel width is fixed mostly in spite of the higher fineness.

The second reason relates to the semiconductor film rimming a source electrode and a drain electrode surrounding the channel portion.

In an ordinary LCD panel, it has the structure designed so that ambient light is not applied to the semiconductor film formed in an integrated manner with a channel portion.

Specifically, by installing a light shielding layer on the color filter substrate opposing to TFT, it is preventing ambient light being applied to the semiconductor film. Such remedy is employed in order to suppress that the off characteristic of TFT is aggravated due to leak current generated in the channel portion when the semiconductor film is exposed to the light.

When the reflowing is performed, the semiconductor film is left so as to rim the source electrode and the drain electrode by surrounding the channel portion. Therefore, when the rimmed portion of remained semiconductor film is exposed to the light, leak current flows inevitably and it deteriorates the off characteristic of the TFT.

In order to suppress deterioration of the transistor characteristic, the area of the light shielding layer arranged on the color filter should be made wide. However, such structure encounters the problem of decreasing an aperture ratio as explained in the above mentioned first reason.

According to a method described by the sixth conventional example, such rim areas of the semiconductor film surrounding the data line, the source electrode and the drain electrode can be reduced to some extent. However, the resist has to be made reflow after forming the data pattern using the pre-reflow resist pattern. For this reason, the method described in the sixth conventional example would not be a perfect measure theoretically.

The sixth conventional example is technology using an exposure mask which controls the light transmittance in three stages, and there are also a lot of other problems. This point will be described later in a problem description of the third related art.

The second problem is described in the followings:

The second problem relates to a damaged layer formed on the resist surface. The damaged layer is formed on the surface of the pre-reflow resist pattern by various treatments such as a development processing, a heat treatment such as pre-baking and post-baking, an etching treatment such as a dry-etching and a wet-etching, and leaving in the atmosphere. This damaged layer is formed chemically and/or physically.

The damaged layer formed on the surface of the pre-reflow resist pattern is not necessarily formed uniformly. That is, there are different damages for every portion. Nonuniformity of such damaged layer induces nonuniformity for the reflow distance of the resist.

In order to solve this problem, the damaged layer formed on the surface of the pre-reflow resist pattern would be removed prior to forming the data pattern. However, uniformity with high accuracy is requested for this removal processing and this processing itself will cause increase of the number of process.

The third problem is described below:

The third problem relates to the surface energy of the foundation substrate on which the resist pattern reflows. Theoretically, the reflow state of the resist is ruled by the surface condition of the foundation substrate, that is, the surface energy.

A case of reflowing the resist by 3 μm on the data line will be described as an example. Assuming that one point with an edge part of the data line is temporarily designated as "A", a spot where it is 1 μm away from the point "A" in a vertical direction is set to a1, and spots from which it is 2 μm away from the point "A" is set to a2, and a spot from which it is 3 μm away from the point "A" is set to a3. Further, another point with an edge part of the same data line away from the point "A" is temporarily designated as "B". A spot where it is 1 μm away from the point "B" in a vertical direction is set to b1, and spots from which it is 2 μm away from the point "B" is set to b2, and a spot from which it is 3 μm away from the point "B" is set to b3.

In order to reflow the resist in a direction perpendicular to the extension direction of the data line, those spots a1, a2 and a3 are not necessarily requested to be the same surface energy. The same applies to those spots of b1, b2 and b3 as well. It is also similar about those spots of a1, b1, a2, b2, a3 and b3.

Here, there is a purpose to transform the resist so that an edge of a post-transform resist pattern after reflow may become parallel to a pre-transform resist pattern, that is, parallel to the data wiring. For that purpose, the degree of the surface energy affecting on the reflow distance up to the point "A" through spot a3 and the point "B" through the spot b3 has to be the same.

However, the surface energy is different on every portion of the substrate provided with the pre-reflow resist pattern. That is, it is because the history of various treatments are remained on the substrate, e.g., the development processing, the heat treatment such as pre-baking and post-baking, the etching treatment such as dry-etching and wet-etching, and the leaving in the atmosphere.

When the pre-transform resist pattern is reflowed under such condition, the post-transform resist pattern becomes wavy pattern.

Thus, in the case of such wavy pattern, the interval between the data wiring and the pixel electrode has to be set widely compared with a case without using the reflow in view of considering the safety thereof. As a result, a decline of an aperture ratio is inevitable.

In such a situation, moreover, in order to cover a channel portion stably by reflowing the resist, the above mentioned interval has to set no smaller than 3 μm with consideration of its safety rate. Therefore, the width of remained rim portions of the semiconductor film surrounding the data wiring, source electrode and drain electrode becomes wider. Accordingly, such a vicious circle is caused as a further decline of the aperture ratio and deterioration of the transistor's off-characteristic.

The fourth problem is described below:

The fourth problem relates to controlling of the resist-reflow end point. When the heat treatment is used, it is necessary to give fluidity to a resist by heating it more than the softening point thereof. On the other hand, in case of using solution and vapor, it is necessary to dissolve the resist and give fluidity to it.

The reflow of the resist depends on such factors as the volume of the resist, the surface energy of the above-mentioned substrate and fluidity of the resist.

Therefore, in order to control the reflow end of the resist by the intended shape with high accuracy, a terminal control technology for stopping the reflow is needed.

Accordingly, such an idea is needed to provide a sort of steps on the substrate to stop the flow of the resist prior to the reflow processing as explained in the background art. Providing such steps on the foundation substrate to hold the reflowed resist, it inevitably increases the number of manufacturing steps. The degree of freedom for the design of a pattern arrangement is deprived.

The fifth problem is described below:

The fifth problem relates to the resist thickness formed on the substrate. The resist thickness for producing a TFT substrate is usually about 1.0-1.5 μm in a usual case which does not resort the reflow process. On the other hand, when reflowing, the resist thickness beyond the usual film thickness is requested.

For this reason, in an exposure step, of course, the luminous exposure has to be made large. Therefore, a decline of the productivity is caused. Moreover, a thick resist film also causes the deterioration of the pattern dimension accuracy simultaneously.

Next, a problem of technology, that is, which swells, and transforms a resist about performing volume expansion of a resist described by the second related art, that is, the third conventional example will be described.

The first problem in the second related art is the same problem as the first problem in the first related art. A pre-swelled resist swells isotropically during swelling processing. Therefore, when a base film is etched by using a post-swelling resist as a mask after swelling, it is left by the shape that the semiconductor film rims around the source electrode, the drain electrode and the data wiring, and the rim-like pattern is formed. This causes a brightness declining in an LCD panel and a deterioration of the transistor's off characteristic.

The second problem in the second related art is the same problem as the second problem of the first related art. When a damaged layer exists on the resist surface before the swelling process, the swelling itself will be obstructed. By removal processing of a damaged layer, an increase in the number of manufacturing process is inevitable.

Next, a technological problem about removing and transforming the part of the resist described in the third related art, that is, the fourth conventional example and the fifth conventional example will be described.

The first problem in the third related art is the same problem as the first problem of the first related art. Even here, there is a problem of a brightness declining and transistor's off-characteristic deterioration in an LCD panel, because the semiconductor film rims around the source electrode, the drain electrode and the data wiring, and it remains to form rimmed pattern.

The first problem in the third related art will be described in detail below.

In manufacturing process of TFT, a method of the third related art is generally used, because it is beneficial to treat a metal film of the data pattern wet etching in view of reduction of the production cost.

In this related art, the data pattern such as the drain electrode, the source electrode and the data wiring is formed by the first etching step of the metal film. Next, a thin resist film arranged on a channel portion is removed by an ashing and development as already explained in the background art.

In general, a resist before reduction (before transformation) arranged on a substrate has a forward tapered shape. Therefore, not only the channel portion but also a metal film such as the drain electrode, the source electrode and data wiring are also exposed so as to be like a rim by using such an isotropy etching as an ashing and development.

In order to expose the channel portion, the resist thickness to be removed is ordinary about 1200-1500 nm. Next, the second isotropic wet etching is performed for the purpose of removing the metal film of the exposed channel portion. At the same time, the exposed portion with the shape of rimming the drain electrode, the source electrode and the data line (frame-like semiconductor film) is also etched, and further, a side etching is also performed.

As a result, semiconductor film is remained around the data pattern such as the source electrode, the drain electrode and the data line so as to rim them with the rim-width of about 1.4-2.0 μm as confirmed by the present inventor.

In the first related art and the second related art, the semiconductor film is extended and remained like rim without changing the original form size of the data pattern. In this related art, in contrast, a metal film is reduced without changing the size of the semiconductor film formed first and thus the semiconductor film remains like rim.

In this way, there are different causes with reverse relation for that the data pattern is rimmed with the semiconductor film, and a TFT is designed such that the line width of the data wiring is made so as not to cause such problem of signal transmission delay. As for a channel, it is designed based on the characteristic of finished product considering the on-off characteristics. Being designed in such ways, problems of the data pattern rimmed with the semiconductor film in the first, second and third related arts are remained as it is.

The second problem in the third related art relates to process for removing the thin resist film arranged on a channel portion such as the ashing (the fourth conventional example) and the development (the fifth conventional example) which are partly explained in the first problem.

A resist before reduction (or pre-reduction resist) is reduced isotropically by the ashing or the development. And an exposed metal film tends to rim the resist pattern after reduction (or post-reduction resist). This exposed width depends on the edge taper angle of the pre-reduction resist. However, in photolithography technique, control of the edge taper angle requires a sophisticated technology compared with such control technology as either area control or thickness control of the resist pattern.

In order to minimize this rimmed width, the edge taper angle of the resist should be set to around 90°, but it requires technical difficulty.

Enlargement of the TFT substrate further complicates the control of taper angle uniformity in the substrate surface.

The third problem in the third related art relates to an exposure mask which specified transmitted light volume of light to three stages.

As to the exposure mask of this type, there are two types, one is using the minute pattern smaller than the exposure resolution and the other is using a semitransparent film. Problems of the both types will be described in order.

First, regarding the mask using the minute pattern smaller than the exposure resolution, there is a difficulty for forming method of either a slit or a grid. A thin resist film located on the channel portion should be formed flatly over the entire channel portion. Actually, however, the resist film becomes cone-shaped or raised shape owing to that the luminous exposure at the area located directly under the slit or grid becomes smaller than that at peripheral area thereof.

The reason of becoming such shapes is based on that there is no designing degree of freedom that arranges the slit and the grid with various shape and size, because the exposure resolution limit of the lithography used for TFT production is about 3.5-4.5 μm, while the channel portion width of ordinary TFT is about 6 μm.

When the resist with the thin channel portion is formed into either the cone shape or the raised shape, in order to secure an intended channel width, the film thickness to be removed by succeeding the ashing or the development have to be set large. Therefore, the semiconductor film which rims the data pattern will be a problem even here.

Next, a mask problem using a semitransparent film is described. The problem here is a method of manufacturing the mask. First, it is a difficult thing to stably form a semi-transparent film with the intended transmission factor. Second, because this kind of mask needs two times of pattern drawing process, there are such problems as an alignment matching accuracy between the first and second drawings, and a repair method for a mask defect at the second drawing.

The fourth problem in the third related art relates to an exposure process. In the exposure process using a usual exposure mask, light is applied to a resist, after making it be exposed to light exactly, the light is continuously applied to it to perform excess exposure.

One of the purposes of excess exposure is to act as the margin-like function for eliminating non-exposure portion completely. The other purpose of the excess exposure is to act as a repair-like function preventing such defect that the film thickness of the resist becomes large when dust is mixed in the resist, by even making the resist of such defect to be exposed to light.

However, when an exposure mask with three stages of light transmission amount is used, the excess exposure is not easy to perform. This is because a relatively thin resist film has to be formed on a channel portion with high accuracy. When the excess exposure is performed too much, the resist on the channel portion is also removed.

Therefore, there is a problem of yield declining due to such defects that a resist is not exposed sufficiently and remained as an exposure delinquent, and a short tends to occurs owing to dust.

The fifth problem in the third related art is a problem about development stability of a thin resist arranged on the channel portion which is already exposed to light to some extent. Because the thin resist arranged on the channel portion is the film that is exposed to light to some extent, it inevitably has the property that dissolves in a certain degree of alkali.

Therefore, the thickness of thin resist film provided on the channel portion after the development has larger fluctuation compared with that of thick resist portion (portion which is not exposed to light).

Furthermore, instability of the resist residual film amount on the channel portion also makes the taper angle of the resist unstable.

When the pre-reduction resist is transformed by the ashing or the development, since these processing is the isotropic etching as explained previously, a channel width is affected. As a result, the TFT characteristic is deteriorated, because the instability of a channel width in the LCD panel is caused and thereby causing instability of the transistor characteristic.

The sixth problem in the third related art relates to exposure unevenness. In an exposure machine used for production of TFT, application of light is performed by usually moving the stage or the lens. Because vibration occurs with movement of the stage or the lens, the distance between the resist and the lens is not fixed precisely. Scattering light which reflected from an exposure stage and the exposure lens or the like is also applied to the resist. From these reasons, the photo irradiation amount to the resist is not necessarily uniform over the entire substrate surface.

In the present apparatus level, when exposing using a usual mask, such thing is not regarded as a problem. However, when a resist film with exposed to light to some extent is left on a substrate, the above-mentioned problem cannot be ignored. Such exposure unevenness causes instability of the residual film amount of the resist on the channel portion like the fifth problem in the third related art, and as a result, it deteriorates the TFT characteristic of the LCD panel.

The seventh problem in the third related art relates to the productivity. In this example, the resist has to be provided with a thick portion, a thin portion and a non-resist portion. Therefore, the resist thickness of the thick portion of this example has to be made beyond about 2.0-2.5 μm thick, which is thicker than a case when a usual method is used. Accordingly, a decline of the productivity due to the luminous exposure increase and deterioration of a size accuracy of the resist as described in the fifth problem of the first related art.

Next, a problem associated with an offset printing of the seventh conventional example and the eighth conventional example will be described.

In the seventh conventional example and the eighth conventional example, a method of manufacturing an electronic component by a relief reversal offset printing is disclosed. However, it is not disclosed about technology for overlapping a fine pattern by using a transfer-printing, and there is no disclosure about alignment for it.

Resist material for a transfer-printing only a single resist layer is disclosed as explained in the background art. However, it is not disclosed about the material for arranging and overlapping resist material.

Resin of disclosed resist material is a resin soluble to organic solvent, and the conductive metal material is not disclosed.

Next, a problem in a ninth conventional example will be described.

The ninth conventional example has the above-mentioned first problem, second problem and fifth problem like a problem in the third related art using a gray (semitransparent) tone mask basically, except for a point using an offset printing method instead of photolithography.

The first problem in the ninth conventional example is the same one described as the first problem in the third related art. That is, there is a problem of a brightness declining and a transistor characteristic deterioration in an LCD panel, because the semiconductor film rims around the source electrode, the drain electrode and the data wiring, and it remains to form rimmed pattern.

The second problem in the ninth conventional example is the same one explained as the second problem in the third related art, and it relates a technical subject removing the second resist pattern by the ashing or the dissolution. Control of the edge taper angle requires the sophisticated technology compared with such control technology as either area control or thickness control of the resist pattern.

In particular, in a case when the transfer-printing is used, in order to set the taper angle of the resist after transfer-printing onto a substrate to the extent to the high value close to around 90°, the shape of the resist formed onto a blanket has to possess almost the same shape of it. Although a gravure offset printing is disclosed in this example, it has to possess this shape in the state that the resist pattern is taken up on the blanket.

In order to form the pattern having such shapes, when a resist is taken up on the blanket from a negative printing plate, a resist has to possess thixotropy of the considerable degree. The material having the high thixotropy generally has good adhesion to a negative printing plate, and thus it is difficult to take up the resist on the blanket and take-up defect tends to occur.

The third problem in the ninth conventional example is similar to one described as the fifth problem in the third related art.

This example (the third related art is also the same) removes an upper layer metal film, a contact layer and the part of the semiconductor film on a channel portion, after removing the second resist pattern arranged on the first resist pattern.

The on/off characteristic of the transistor is determined by the width and the length (W/L) of the channel, and in this example, it is determined by the first resist pattern after removing the second resist pattern.

Therefore, when the second resist pattern is removed, unless either selecting the material from which the first resist pattern is not removed, or selecting process condition, it will deviate from the initial set value of W/L. In order to avoid such problem, the amount from which the first resist pattern is removed is taken account of at the time of the second resist pattern removal, and it also can be though that the value of W/L should be determined by the first resist pattern. However, "control of the taper angle of the resist pattern edge" described by the second problem become a problem and is not easy to solve in such situation. Mother Glass and a display screen size used for production of the LCD device are tended to become large size. Accordingly, in order to have an influence on the workmanship of the channel size and uniformity, the above-mentioned problem is closely related to a display unevenness problem of a large size LCD device.

When the second resist pattern is removed, if finding the material and the condition from which the first resist pattern is not removed, after the second resist pattern is arranged at least on the first resist pattern arranged on the substrate, it needs to be a conFIGuration with which they do not mix each other.

SUMMARY

An exemplary object of the invention is to provide an electronic component, particularly a display device manufactured by using an efficient pattern formation method.

In order to achieve the above-mentioned object, an electronic component of the present invention can be provided by using a following pattern formation method: on a substrate treated with a first etching with first resist patterns as a first mask, a second resist pattern is transfer-printed on the first resist patterns so as to connect a gap between the first resist patterns, and then a second etching is performed by using the first resist patterns and the second resist pattern as a second mask. The first resist pattern is used for forming the source electrode part and the drain electrode part of a transistor, and the second resist pattern is used to protect a channel portion of the transistor.

An electronic component of the present invention can be provided by using a following pattern formation method: on a substrate treated with a first etching with a first resist pattern as a first mask, a second resist pattern is transfer-printed on the first resist patterns so as to partially overlap with the first resist pattern and partially extended from the first resist pattern, and then a second etching is performed by using the first resist pattern and the second resist pattern as a second mask.

The first resist pattern and the second resist pattern are used for forming wirings and/or terminals, and the extended portion of the second resist pattern is used to make the wirings to have a cross section of a stair-like edge shape.

A display device of the present invention can be provided by using a following manufacturing method of a thin film transistor (TFT): performing a first etching to a substrate provided with a gate pattern and films laminated thereon with an insulating film, a semiconductor film, a contact film and an upper layer metal film in that order to remove at least the upper layer metal film and the contact film and thereby forming a channel portion of the transistor and a data pattern including a drain electrode, a source electrode, a data terminal and a data wiring; transfer-printing a second resist pattern at least on the first resist pattern located on both side portions of a channel portion and to cover the channel portion; and performing a second etching by using the first resist pattern and the second resist pattern as a second mask to remove the semiconductor film for revealing the insulating film and thereby processing the semiconductor film into an island-shaped pattern.

A display device of the present invention can be provided by using a following manufacturing method of a TFT: performing a first etching with a first resist pattern as a first mask to partially remove a film forming a data pattern; transfer-printing a second resist pattern at least to cover a portion of the first resist pattern and to be extended from the first resist pattern; and performing a second etching by using the first resist pattern and the second resist pattern as a second mask to remove entire film used for the data pattern and thereby making the data pattern to have a cross section of a stair-like shape.

A display device of the present invention can be provided by using a following manufacturing method of a TFT: performing a first etching with a first resist pattern as a first mask to partially remove a film forming a gate pattern; transfer-printing a second resist pattern at least to cover a portion of the first resist pattern and to be extended from the first resist pattern; and performing the second etching by using the first resist pattern and the second resist pattern as a second mask to remove entire film used for the gate pattern and thereby making the gate pattern to have the cross section of a stair-like shape.

Accordingly, an electronic component, particularly a display device can be produced with high-quality and high productivity by using the pattern formation method according to the present invention.

BRIEF DESCRIPTION OF THE DRAWINGS

Exemplary features and advantages of the present invention will become apparent from the following detailed description when taken with the accompanying drawings in which:

FIG. 1A is a plan view showing one step of manufacturing an inverted-stagger type TFT according to the first exemplary embodiment of the present invention.

FIG. 1A-I, FIG. 1A-II and FIG. 1A-III are cross sectional views which indicate a section along I-I' line, II-II' line and III-III' line of FIG. 1A, respectively.

FIG. 1B is a plan view showing post-process of a step shown in FIG. 1A.

FIG. 1B-I, FIG. 1B-II and FIG. 1B-III are cross sectional views which indicate a section along I-I' line, II-II' line and III-III' line of FIG. 1B, respectively.

FIG. 1C is a plan view showing post-process of a step shown in FIG. 1B.

FIG. 1C-I, FIG. 1C-II and FIG. 1C-III are cross sectional views which indicate a section along I-I' line, II-II' line and III-III' line of FIG. 1C, respectively.

FIG. 1D is a plan view showing post-process of a step shown in FIG. 1C.

FIG. 1D-I, FIG. 1D-II and FIG. 1D-III are cross sectional views which indicate a section along I-I' line, II-II' line and III-III' line of FIG. 1D, respectively.

FIG. 1E is a plan view showing post-process of a step shown in FIG. 1D.

FIG. 1E-I, FIG. 1E-II and FIG. 1E-III are cross sectional views which indicate a section along I-I' line, II-II' line and III-III' line of FIG. 1E, respectively.

FIG. 1F is a plan view showing post-process of a step shown in FIG. 1E.

FIG. 1F-I, FIG. 1F-II and FIG. 1F-III are cross sectional views which indicate a section along I-I' line, II-II' line and III-III' line of FIG. 1F, respectively.

FIG. 1G is a plan view showing post-process of a step shown in FIG. 1F.

FIG. 1G-I, FIG. 1G-II and FIG. 1G-III are cross sectional views which indicate a section along I-I' line, II-II' line and III-III' line of FIG. 1G, respectively.

FIG. 2A-I, FIG. 2A-II, FIG. 2A-III and FIG. 2A-IV are cross sectional views which indicate a section along I-I' line, II-II' line, III-III' line and IV-IV' line of FIG. 2A, respectively.

FIG. 2B is a plan view showing post-process of a step shown in FIG. 2A.

FIG. 2B-I, FIG. 2B-II, FIG. 2B-III and FIG. 2B-IV are cross sectional views which indicate a section along I-I' line, II-II' line, III-III' line and IV-IV' line of FIG. 2B, respectively.

FIG. 2C is a plan view showing post-process of a step shown in FIG. 2B.

FIG. 2C-I, FIG. 2C-II, FIG. 2C-III and FIG. 2C-IV are cross sectional views which indicate a section along I-I' line, II-II' line, III-III' line and IV-IV' line of FIG. 2C, respectively.

FIG. 4A-I is a cross sectional view showing a section along I-I' line of FIG. 4A.

FIG. 4B is a plan view showing the fifth exemplary embodiment of the present invention.

FIG. 4B-I is a cross sectional view showing a section along I-I' line of FIG. 4B.

FIG. 5A-I is a cross sectional view showing a section along I-I' line of FIG. 5A.

FIG. 5B is a plan view showing the seventh exemplary embodiment of the present invention.

FIG. 5B-I is a cross sectional view showing a section along I-I' line of FIG. 5B.

FIG. 6A is a plan view showing the eighth exemplary embodiment of the present invention.

FIG. 6A-I, FIG. 6A-II, FIG. 6A-III and FIG. 6A-IV are cross sectional views which indicate a section along I-I' line, II-II' line, III-III' line and IV-IV' line of FIG. 6A, respectively.

FIG. 6B is a plan view showing the eighth exemplary embodiment of the present invention.

FIG. 6B-I, FIG. 6B-II, FIG. 6B-III and FIG. 6B-IV are cross sectional views which indicate a section along I-I' line, II-II' line, III-III' line and IV-IV' line of FIG. 6B, respectively.

FIG. 6C is a cross sectional view corresponding to FIG. 6B-IV.

FIG. 6C-IV is an enlarged sectional view which expands a part surrounded with a ring shown in FIG. 6C.

FIG. 7A is a plan view showing a first modification of the eighth exemplary embodiment of an inverted-stagger type TFT of the present invention.

FIG. 7A-V is a cross sectional view showing a section along V-V' line of FIG. 7A.

FIG. 7B is a plan view showing post-process of a step shown in FIG. 7A.

FIG. 7B-V is a cross sectional view showing a section along V-V' line of FIG. 7B.

FIG. 15A-X is a cross sectional view along X-X' line of FIG. 15A.

FIG. 15B is a plan view showing post-process of FIG. 15A.

FIG. 15B-X is a cross sectional view along X-X' line of FIG. 15B.

EXEMPLARY EMBODIMENT

Figure 1C:
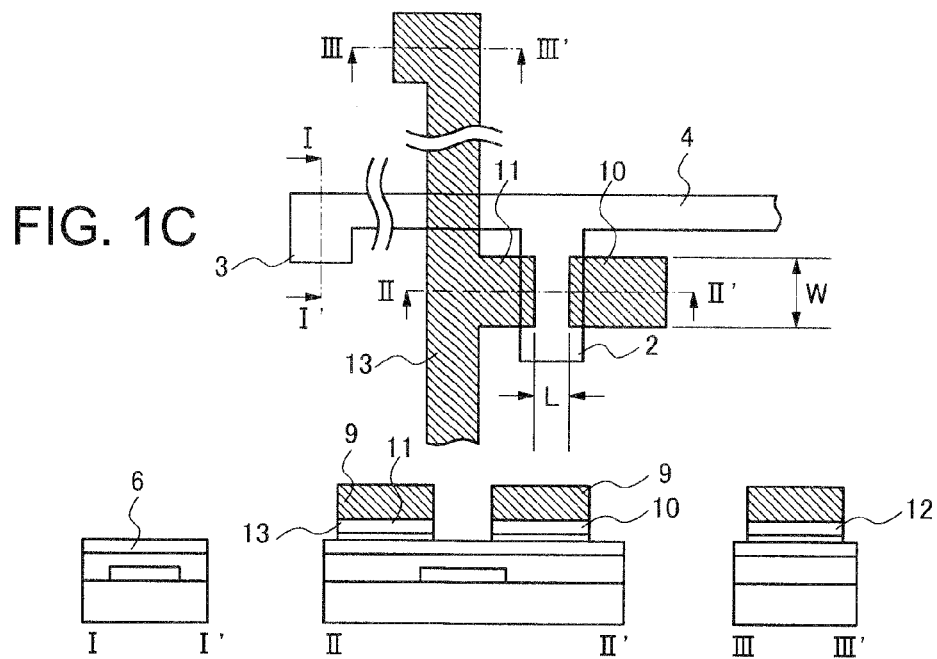

Exemplary embodiments of the present invention will now be described in detail in accordance with the accompanying drawings.

Embodiments of the present invention will be described in detail referring to the drawings.

The First Exemplary Embodiment

FIG. 1 shows the first exemplary embodiment of the present invention. FIG. 1A through FIG. 1G indicates a process of manufacturing in inverted-stagger type TFT in this exemplary embodiment in order Each of FIG. 1A through FIG. 1G located in the upper part of FIG. 1 is a plan view of each TFT substrate, and its cross sectional views along those lines of I-I', II-II' and III-III' in FIG. 1A through FIG. 1G are shown in the lower part of FIG. 1. More specifically, the cross sectional views along the lines of I-I' shows each gate terminal portion (hereinafter, referred to as the gate terminal) to be connected to an external circuit, and the gate terminal is derived from a gate electrode of the liquid crystal display (LCD) panel through gate wiring. The cross sectional views along the lines of II-II' illustrate each transistor portion. The cross sectional views along the lines of III-III' shows a data terminal portion (hereinafter, referred to the data terminal) to be connected to the external circuit, the data terminal is derived from a source electrode of the LCD panel through data wiring.

First, a lower layer metal film made of Chromium (Cr) with the thickness of 300 nm is formed by well-known sputtering method on an insulating substrate 1 made of a transparent substrate such as a glass substrate. After that, the metal film is patterned to form a gate pattern including a gate electrode 2, a gate terminal 3 and a gate wiring 4 by using a well-known photolithography method (coating a resist, exposing and developing the coated resist), an etching method and a stripping method (FIG. 1A and FIG. 1A-I through FIG. 1A-III).

Next, by using a well-known method such as CVD (Chemical Vapor Deposition), an insulating substrate 1 provided with a gate pattern is covered with a gate insulation film 5 of a silicon nitride film with thickness of 300 nm, a semiconductor film 6 of an amorphous silicon film with thickness of 200 nm, and a contact film 7 of n-type amorphous silicon film which doped with phosphorus with thickness of 30 nm are formed in that order. And an upper layer metal film 8 made of Cr with thickness of 300 nm is formed by a well-known magnetron sputtering method. Here, a gate insulation film 5, semiconductor film 6 and a contact film 7 may be formed successively in the same film-forming chamber.

After that, a first resist pattern 9 is formed by using a well-known photolithography method including coating a photosensitive resist, exposing it and developing it (FIG. 1B and FIG. 1B-I through FIG. 1B-III) Next, by using the first resist pattern 9 as a mask, an upper layer metal film 8 is subjected to a first time of a first etching process with etchant of ceric ammonium nitrate system to form the data pattern including a drain electrode 10, a source electrode 11, a data terminal 12 and a data wiring 13, and revealing a contact layer 7. And then the exposed contact layer 7 is removed by a dry etching (a second time of the first etching) such as a PE (Plasma Etching) method using mixed gas of HCl/SF$_6$/He/O$_2$ to reveal the semiconductor film 6 (FIG. 1C and FIG. 1C-I through FIG. 1C-III).

Next, it made a resist pattern (hereinafter, "the pre-transfer resist pattern") with its fluidity lowered to the extent of keeping the shape to the degree (the degree of thixotropy that the shape is held) is formed on a sheet of a silicon member having elasticity and flexibility (hereinafter, referred to as a "blanket"). The pre-transfer resist pattern is contacted to the insulating substrate 1 such that a second resist pattern 14 is transfer-printed on a channel portion so as to partially overlap the drain electrode and the source electrode covered with the first resist pattern 9. (It is explained in detail later about a method to form the pre-transfer resist pattern on the blanket and transfer-print it on the insulating substrate 1.) And then, a solvent of the second resist pattern 14 is evaporated by heating the insulating substrate 1 to further lower its fluidity.

The purpose of providing the second resist pattern 14 is to ensure covering and protecting a portion (hereinafter, referred to as "channel portion") which becomes a channel when the TFT is completed. Therefore, the second resist pattern 14 is provided not only on the channel portion but also on the first resist pattern 9 (i.e., the first resist pattern 9 arranged on the drain electrode 10 and the source electrode 11 neighboring the channel portion) such that the first resist pattern 9 and the second resist pattern 14 are overlapped each other by 2 μm width adjacent to the channel portion, respectively.

Here, the second resist pattern 14 is not provided on the data wiring, the data terminal, and other sides of the source electrode 11 and the drain electrode 10 not located adjacent to the channel portion (i.e., remote sides of the channel portion by a distance of 2 μm or more) (FIG. 1D and FIG. 1D-I through FIG. 1D-III).

In this exemplary embodiment, when the channel width (designated by the letter L in FIG. 1C) of the TFT is 6 μm and the channel length (designated by the letter W in FIG. 1C) is 25 μm, the second resist pattern 14 is designed to have the size of 10 μm in the L direction and 25 μm in the W direction.

Next, a dry etching (the second etching) of PE system using mixed gas of HCl/SF$_6$/He/O$_2$ is performed by using the resist patterns as a mask to reveal the gate insulation film 5 by removing the semiconductor film 6, and an island pattern 15 is formed. And the resist patterns are removed from the insulating substrate 1 using a stripping solution such as dimethyl sulfoxide and monoethanolamine or the like (FIG. 1E and FIG. 1E-I through FIG. 1E-III).

And a protective insulation film 16 of silicon nitride film with 200 nm thickness is formed by using a CVD method on the insulating substrate 1 which is provided with the gate insulation film 5 and the data pattern exposed thereon. Then the resist pattern is formed by a photolithography method, which include such process of forming, removing the protective insulation film 16 and the gate insulation film 5 by well-known etching method, and stripping the resist pattern, and thereby forming a contact hole of a gate terminal hole 17, a data terminal hole 18 and a pixel connection hole 19 (FIG. 1F and FIG. 51F-I through FIG. 1F-III).

Figure 1D:
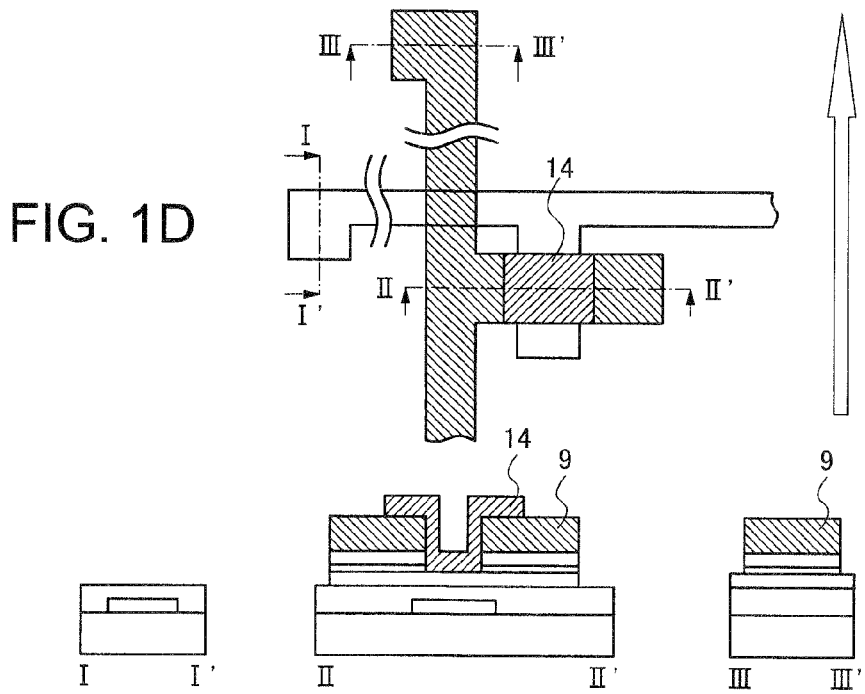
Figure 1E:
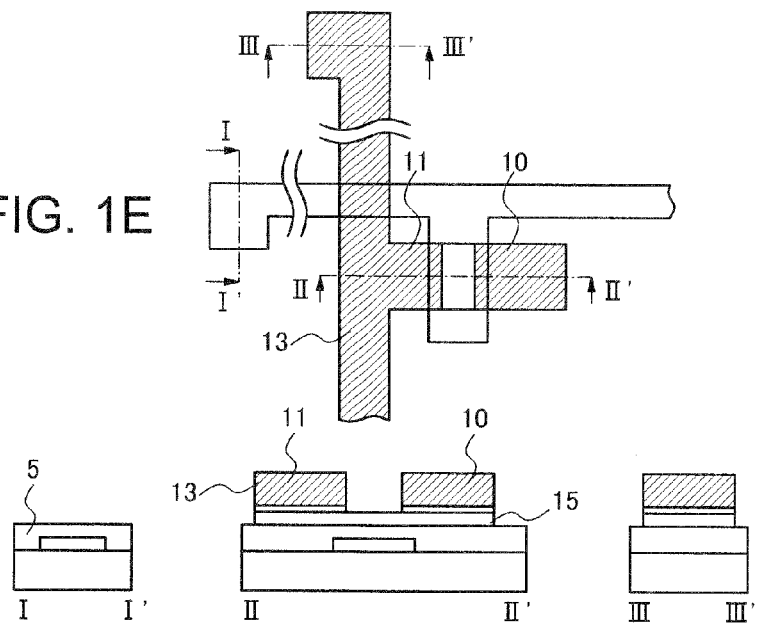
Figure 1F:
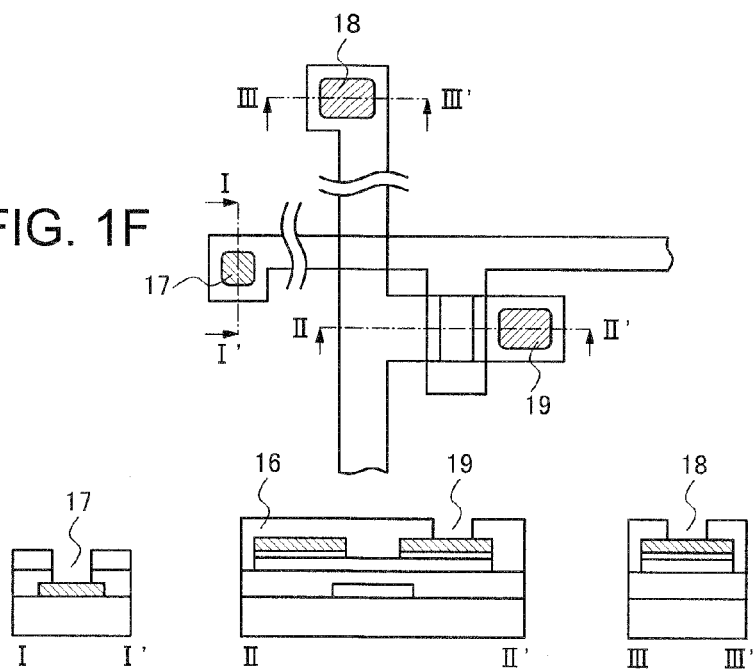
Figure 1G:
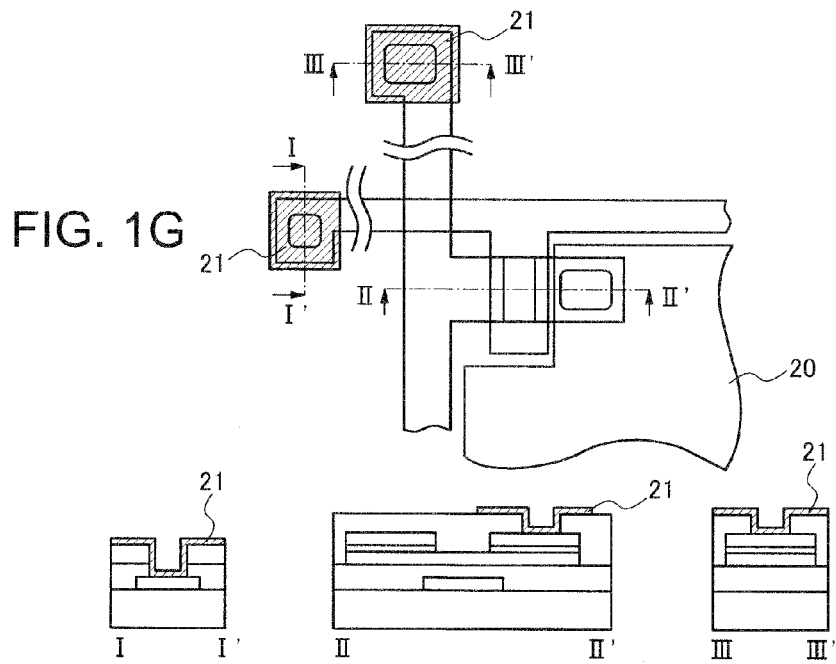

And finally, after forming a conductivity transparent film of Indium-Tin-Oxide (ITO) with 40 nm of thickness by the sputtering method, a pixel electrode 20 and the terminal protective pattern 21 are formed by using the photolithography method and the etching method, and thereby completing a TFT substrate (FIG. 1G and FIG. 1G-I through FIG. 1G-III).

The opposed substrate is provided with a light shielding layer to prevent a light incident at least to the island pattern 15 (channel portion). The completed TFT substrate is arranged with an opposed substrate with a predetermined gap. The opposed substrate may be further provided with color layers of red, blue and green for enabling it color display. (Hereinafter, the opposed substrate is called as a color filter substrate.) And then an LCD panel is obtained by filling the gap between the two substrates with liquid crystal, and further providing optical films such as a phase difference plate and polarizing plates on outside surfaces of the two substrates.

A method of manufacturing the LCD panel will be described more in detail. An alignment film is provided on the inner surfaces of the TFT substrate and the color filter substrate touching the liquid crystal. The alignment film is made of polyimide resin, for example, and it is rubbed with a rayon cloth for alignment processing. The alignment angle of the above-mentioned two substrates is about 90° in case of a Twisted Nematic (TN) mode and is about 0° in case of an In Plane Switching (IPS) mode. Further, an alignment process does not need to be performed in case of Vertical Alignment (VA) mode. FIG. 1A through FIG. 1G of this exemplary embodiment shows the case of the TN mode.

After the alignment treatment, the sealing agent mixed with seal spacers is provided on either a TFT substrate or a color filter substrate at a frame area of the LCD panel, while internal spacers and liquid crystal are provided at a display region. Then two substrates are overlapped with the gap filled with the liquid crystal, and optical films are provided on outer surfaces of the two substrates to make the LCD panel.

Thus, the completed LCD panel is connected with an external circuit for driving the LCD panel through gate terminal contact holes 17 and data terminal contact holes 18. And a light source member is arranged, and then chassis for holding and protecting those members are arranged to form an LCD device.

In a description of this exemplary embodiment, although the second resist pattern 14 is provided after exposing the semiconductor film 6 by removing the contact layer 7 before arranging the second resist pattern 14, the second resist pattern 14 may be provided after further removing the part of the semiconductor film before arranging the second resist pattern 14. In this way, by further removing the part of the semiconductor film, the amount of leak current at the channel portion can be further reduced and thus transistor performance is improved.

In this exemplary embodiment, although the overlapping width of the second resist pattern 14 and the first resist pattern 9 covering the drain electrode 10 and the source electrode 11 adjacent to the channel is set to be 2 μm, it is not limited to this value. This overlapping width of the first and second resist patterns can achieve the intended purpose of the present invention by contacting the second resist pattern 14 with the first resist pattern 9. Accordingly, the term of "overlapping" in the description of the present invention includes the case of that the first resist pattern 9 and the second resist pattern 14 are touching each other.

In this exemplary embodiment, a reason for not providing the second resist pattern 14 on the data wiring 13 is to secure an aperture ratio.

The reason of that the second resist pattern 14 is not provided on the source and drain electrodes 11 and 10 which are not adjacent to the channel portion is to secure the transistor characteristic by suppressing the leak current.

Thus, according to this exemplary embodiment, the second resist pattern can be easily arranged with high degree of freedom in the arbitrary size, the arbitrary shape, and the arbitrary position, because it is arranged by touching with the insulating substrate.

Therefore, the present invention can solve such problems that declining of the panel brightness due to decreasing of the aperture ratio and off characteristic problem of the transistor which are described in the problem of the conventional example (the first problem of the first related art, the first problem of the second related art, and the first problem of the third related art).

Furthermore, in the present invention, since the first resist pattern is transformed after transfer-printing the pre-transfer resist pattern, which has lower fluidity to the extent of keeping the shape so that it may overlap with the first resist pattern, following problems can be solved, that is, a problem of controlling a reflow of a resist associated with the first related art (the second problem: the damaged layer removal and the third problem: the surface energy of the foundation substrate and the fourth problem: reflow end point control) and problem of swelling obstruction by a damaged layer related to the second problem of the second related art.

In the present invention, moreover, since the pre-transfer resist pattern is transfer-printed on the first resist pattern as the second resist pattern, which is different from the first resist pattern, there are no problems of the taper angle control for the resist described in the second problem of the third related art and problems about exposure described in the third problem or the sixth problem of the third related art.

The needed film thickness of the second resist pattern of the present invention is enough to be the film thickness of having endurance to the second etching can be maintained and thus which can be set to the thin resist thickness. Therefore, there are also no problems of a decline of the productivity and a deterioration of the resist pattern size as described in the fifth problem of the first related art and the seventh problem of the third related art.

Although the first exemplary embodiment has been explained in detail above, a configuration in detail is not limited to this exemplary embodiment and even if there is change or the like in the design in the range that does not deviate from a point of this invention, those changes are also included in this invention.

A content of the first exemplary embodiment of the present invention is to form the pattern efficiently by arranging the second resist pattern on the first resist pattern by a transfer-printing method such that at least a part of it is extended to the extent that they are overlapped each other on a substrate which had been subjected to the first etching with the first resist pattern as a mask, and performing the second etching after that.

In this exemplary embodiment, although an example of a chromium (Cr) film is formed by the magnetron sputtering technique for the lower layer metal film and the upper layer metal film, its material is not limited to Cr but other metal films having electrical conductivity such as Mo, Al, Ti, Cu and Ag, are available. Moreover, other example of such films mixed with the above-mentioned metal or an alloy added with compositions of Nd, N, Nb, V and C are also available. In addition, a laminated film with more than two kinds of the metal and alloy are also available. A film-forming method is also not limited to the magnetron sputtering.

Furthermore, as to the film such as the gate insulation film, the semiconductor film and the contact film, the present invention is also not limited to the indicated examples of the kind of the films, the thickness of the film and a method of film-forming so long as the film achieves its intended purpose.

Since this exemplary embodiment is feasible so long as the purpose of the present invention is obtained, it is available in spite of the configuration of the data pattern, the gate insulation film, the semiconductor film and the contact film.

The Second Exemplary Embodiment

Figure 2A:
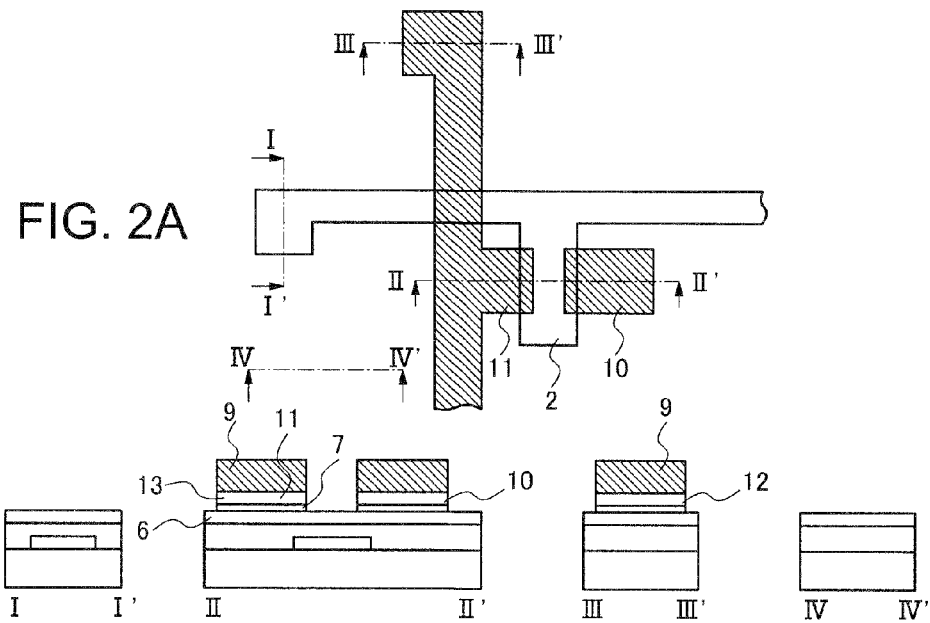
FIG. 2A is a plan view showing one step in the middle of producing by the second exemplary embodiment of inverted-stagger type TFT of the present invention.
Figure 2B:
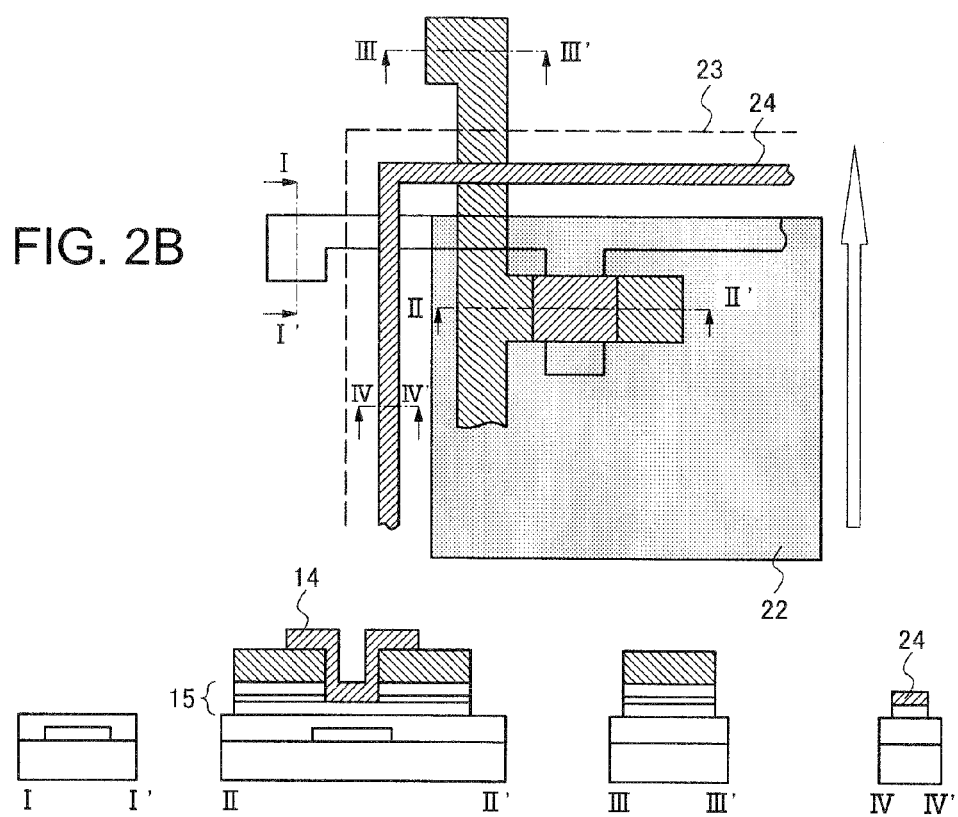
Figure 2C:
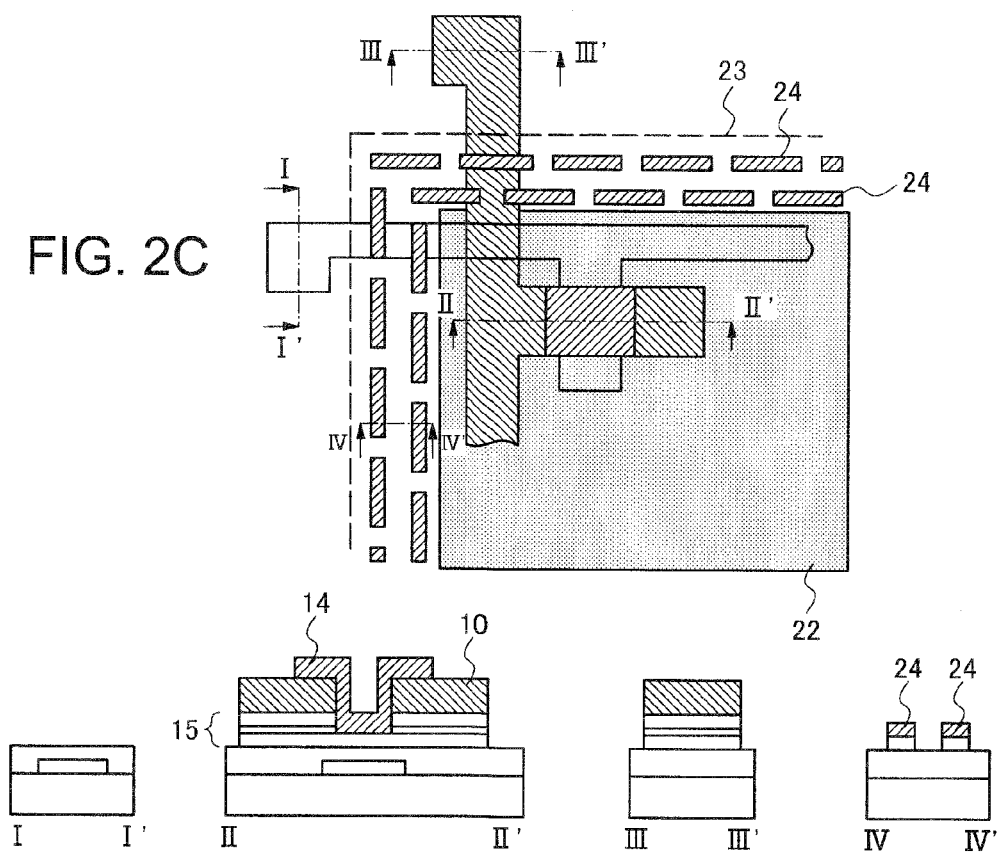

FIG. 2 describes the second exemplary embodiment of the present invention. The way of illustrating the drawings is the same as those of the first exemplary embodiment.

A difference point between this exemplary embodiment and the first exemplary embodiment is arrangement of the second resist pattern. In the following, a technical point of difference between the first exemplary embodiment and this exemplary embodiment will be described in detail.

On a substrate (FIG. 2A and FIG. 2A-I through IV) which had been subjected to such processes as forming the data pattern such as the drain electrode 10, the source electrode 11, the data terminal 12 and the data wiring 13, removing the contact film 7 to expose the semiconductor film 6 by using the first resist pattern 9 as a mask, the pre-transfer resist pattern formed on the blanket is contacted so that the second resist pattern 14 is transfer-printed on the substrate, and after that, the substrate is heated.

In the first exemplary embodiment, the second resist pattern 14 is arranged to be transfer-printed so as to be overlapped with the part of the drain electrode and the source electrode provided with the first resist pattern 9 and to cover a channel portion by contacting the pre-transfer resist pattern with the insulating substrate 1. In this exemplary embodiment on the other hand, the second resist pattern (the frame-shaped second resist pattern 24) is extendedly arranged so that an LCD pixel region 22 is surrounded thereby between the LCD pixel region 22 and the frame seal area 23 of sealing material in addition to the channel portion.

The arrangement of the second resist pattern 14 on a channel portion is the same as the first exemplary embodiment. The width of the frame-shaped second resist pattern 24 is around 25 μm which is extended and arranged so that an LCD pixel region 22 is surrounded thereby.

And the second etching is performed to form the island pattern 15 (FIG. 2B and FIG. 2B-I through IV) by removing the semiconductor film 6 and exposing the gate insulation film 5. After that, the resist pattern is peeled and it is removed from the substrate.

According to the above mentioned processing, a convex structure made of the semiconductor film is formed between the LCD pixel region 22 and the frame seal area In this exemplary embodiment, because the frame-shaped second resist pattern 24 is extended between the LCD pixel region 22 and the frame seal area 23, the second resist pattern 24 extends to be overlapping with the first resist pattern 9 that covers the data wiring.

In this way, when installing the convex structure between the LCD pixel region 22 and the frame seal area 23, it can be suppressed that a low-molecular ingredient and impurities contained in the organic resin sealing material or the like (in the sealing material of the epoxy resin, for example, low molecular weight constituent and siloxane of epoxy) flow out into the LCD pixel region 22. Therefore, a voltage retention decline of liquid crystal caused by those dissolving in liquid crystal can be prevented, and also prevent to polarize an alignment film and prevent to deteriorate alignment restraining force owing to adsorption or adhesion of those impurities to the alignment film. As a result, panel display unevenness can be avoided.

When higher display unevenness inhibiting effect is desired, it should perform a plurality of arrangement of the frame-shaped second resist pattern 24 between the LCD pixel region 22 and the frame seal area 23 to form a plurality of convex structures. By arranging a plurality of convex structures, barriers for the impurities becomes complicated in three dimensions, and thus it enables to suppress the spread of the impurities into the LCD region.

It is also possible to prevent the spread of impurities into the LCD region in view of a technological thought that makes a planar distance between the LCD pixel region 22 and the frame seal area 23 long. That is, as shown in FIG. 2C and FIG. 2C-I through FIG. 2C-IV, a plurality of the frame-shaped second resist patterns 24 with gaps are arranged such that the gaps of adjacent patterns 24 are arranged alternately so as not be placed on the same line extending either a horizontal direction or a vertical direction. The second isolated resist patterns do not need to overlap with the first resist pattern.

Next, modification of the second exemplary embodiment will be described.

The frame-shaped second resist pattern 24 is arranged in the frame seal area 23 with 700 μm in width, and a convex structure of semiconductor film 6 is formed by using the above-mentioned method.

Thus, the difference in the height of the film of the frame seal area 23 and an LCD pixel region 22 can be made minimum.

Thus, the size of the mixed seal spacer in the sealing agent and the size of the spacer in the display area can be brought close. As a result, an frame-shaped unevenness (hereinafter, "frame unevenness") along the frame seal which occurs by the difference between the panel gap adjacent to the frame and the panel gap of the LCD pixel region 22 can be avoided.

Thus, when arranging the frame-shaped second resist pattern 24 between the LCD pixel region 22 and the frame seal area 23 where sealing material is arranged, the panel display unevenness can be suppressed, and when forming it in a frame seal area 23, frame spots can be suppressed. When the two above-mentioned frame-shaped second resist patterns 24 are separately arranged together, more display unevenness and frame spots can be suppressed simultaneously.

Although it has been explained in detail with reference to drawings about the second exemplary embodiment and the modification of the present invention above, a configuration in detail is not limited to this exemplary embodiment and even if there is change or the like in the design in the range that does not deviate from a point of this invention, it is included in this invention.

A content of the second exemplary embodiment and the modification of the present invention is to form the pattern efficiently by forming a convex structure appropriately to suppress display unevenness and frame spots, and also by arranging the second resist pattern on the first resist pattern by a transfer-printing method such that at least a part of it is extended to the extent that they are overlapped each other on a substrate which had been subjected to the first etching with the first resist pattern as a mask, and by arranging simultaneously the isolated second resist pattern, which does not necessarily overlap with the first resist pattern, and performing the second etching after that.

In a conventional example, accordingly, a convex structure made of such semiconductor film only cannot be formed, because the isolated second resist pattern cannot be formed without overlapping with the first resist pattern.

The Third Exemplary Embodiment

Figure 3:
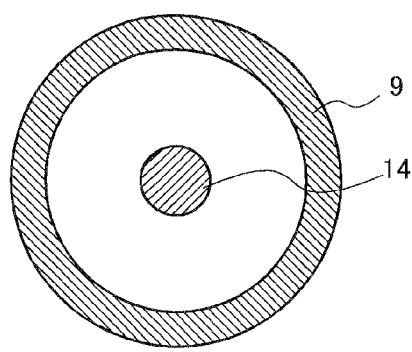
FIG. 3 is a plan view of an overlapping marker which indicates the third exemplary embodiment of the present invention.

Next, the third exemplary embodiment of the present invention will be described. FIG. 3 is a plan view of this exemplary embodiment.

A point of difference between this exemplary embodiment and the first exemplary embodiment is an arrangement relation between the first resist pattern and the second resist pattern. Others are the same as that of the first exemplary embodiment. Different points between the first exemplary embodiment and this exemplary embodiment will be described in detail here.

Although this exemplary embodiment is the same as that of the first exemplary embodiment in a point that the first resist pattern and the second resist pattern are overlapped and a part of which is arranged so as to be protruded on the insulating substrate, it is different in a point that the isolated first resist pattern is formed without overlapping with the second resist pattern, and also the isolated second resist pattern is formed without overlapping with the first resist pattern.

FIG. 3 indicates the state of the isolated first resist pattern 9 and the isolated second resist pattern 14.

A circular shape shown in the FIG. 3 is a marker (overlapping marker) which is provided for the purpose of confirming the superposition accuracy of the first resist pattern 9 and the second resist pattern 14.

In this exemplary embodiment, the first resist pattern 9 has a shape like a ring, and the second resist pattern 14 is arranged inside thereof with a shape like a circle.

And it is designed so that the second resist pattern 14 may be located in the center of the first resist pattern 9 when the arrangement position of the first resist pattern 9 and the second resist pattern 14 is correct.

Here, the first resist pattern 9 is designed to have an inner diameter of 15 µm, and an outer diameter of 25 µm, while the second resist pattern 14 is designed to have a diameter of 10 µm.

Thus, the arrangement relation between the first resist pattern 9 and the second resist pattern 14 can be confirmed by providing the overlapping marker appropriately on the insulating substrate.

Furthermore, by measuring a relative position relation of the overlapping marker, and feed backing its difference amount to a transfer-printing apparatus as the offset amount when transfer-printing the second resist pattern 14 on the insulating substrate, and then applying it to succeeding substrate, the superposition accuracy of the first resist pattern and the second resist pattern can be improved.

Although the first resist pattern is arranged outside, while the second resist pattern is arranged inside, the location thereof may be reversed. Here, although the ring-shaped overlapping marker is illustrated, it may be the shape other than the ring, for example, a square, a triangle and a cross. The above mentioned ring-shaped marker is designed by assuming that the measurement of the superposition accuracy is made with an automatic measurement apparatus, but in the case of depending on visual inspection using a microscope or the like, it should be made a vernier marker.

Although it has been explained in detail with reference to the drawings about the third exemplary embodiment of the present invention above, a configuration in detail is not limited to this exemplary embodiment and even if there is change or the like in the design in the range that does not deviate from a point of this invention, it is included in this invention.

A content of the third exemplary embodiment of the present invention is to form the pattern efficiently by arranging the second resist pattern on the first resist pattern by the transfer-printing method such that at least a part of it is extended to the extent that they are overlapped each other on the substrate which had been subjected to the first etching with the first resist pattern as a mask, and by arranging simultaneously the isolated second resist pattern, which does not overlap with the first resist pattern, and thereby revealing such portions as an overlapped and the protruded portion of the first and second resist patterns, a portion of the isolated second resist pattern that is not overlapped with the first resist pattern, and a portion of the first resist pattern that does not overlap with the second resist pattern on the substrate after the transfer-printing, and performing the second etching after that.

The Fourth Exemplary Embodiment

Next, the fourth exemplary embodiment will be described.

Although this exemplary embodiment is the same as that of the first exemplary embodiment in that arranging the second resist pattern on the first resist pattern by the transfer-printing method such that at least a part of it is extended to the extent that they are overlapped each other on a substrate which had been subjected to the first etching with the first resist pattern as a mask, and the overlapped and protruded portion of the first and second resist patterns is arranged on the insulating substrate after the transfer-printing, it is different in a point that a portion of the isolated first resist pattern without overlapping with the second resist pattern is arranged.

As described before, since an upper layer metal film 8 is made of an opaque film such as Cr or the like, by arranging the first resist pattern 9 in the isolated pattern so as not overlap with the second resist pattern, it can be used effectively not only as a product recognition marker of the lot number of the product and the operation number, but also as overlapping markers used in data pattern forming step and other steps such as overlapping markers used for forming steps of a data pattern forming step and a gate pattern forming step; a data pattern forming step and a contact hole pattern forming step; and a data pattern forming step and a pixel electrode pattern forming step.

The reason of arranging the first resist pattern 9 in the isolated shape without overlapping with the second resist pattern 14 is that the first etching pattern is not rimmed with the second etching pattern after the second etching. When the first etching pattern is rimmed, misjudgment is caused in measurement by an automatic recognition measurement apparatus, owing to the fact that the semiconductor film to be removed by the second etching is a semitransparent film.

By arranging the first resist pattern 9 in this way, a product recognition marker and an overlapping marker or the like can be formed efficiently.

In the above-mentioned description, since the first etching pattern is not rimmed with the second etching pattern, the second resist pattern is not arranged on the first resist pattern. But if some space can be reserved on the substrate, the second resist pattern can be overlapped on the first resist pattern and it may be formed so as to be protruded. In such a case, however, it is needed to secure the amount of protruding portion so as not to be misjudged in measurement by the automatic recognition measurement apparatus.

Although it has been explained in detail about the fourth exemplary embodiment of the present invention above, a configuration in detail is not limited to this exemplary embodiment and even if there is change or the like in the design in the range that does not deviate from a point of this invention, it is included in this invention.

A content of the fourth exemplary embodiment of the present invention is to form the pattern efficiently by arranging the second resist pattern on the first resist pattern by the transfer-printing method such that at least a part of it is extended to the extent that they are overlapped each other on the substrate which had been subjected to the first etching with the first resist pattern as a mask, and revealing an overlapped and protruded portion of the first and second resist patterns, and a portion of the isolated first resist pattern that does not overlap with the second resist pattern on the substrate after the transfer-printing, and performing the second etching after that.

Next, as the second technological thought about the present invention, technology which controls the cross-sectional shape of the etching pattern will be described.

The Fifth Exemplary Embodiment

Figure 4A:
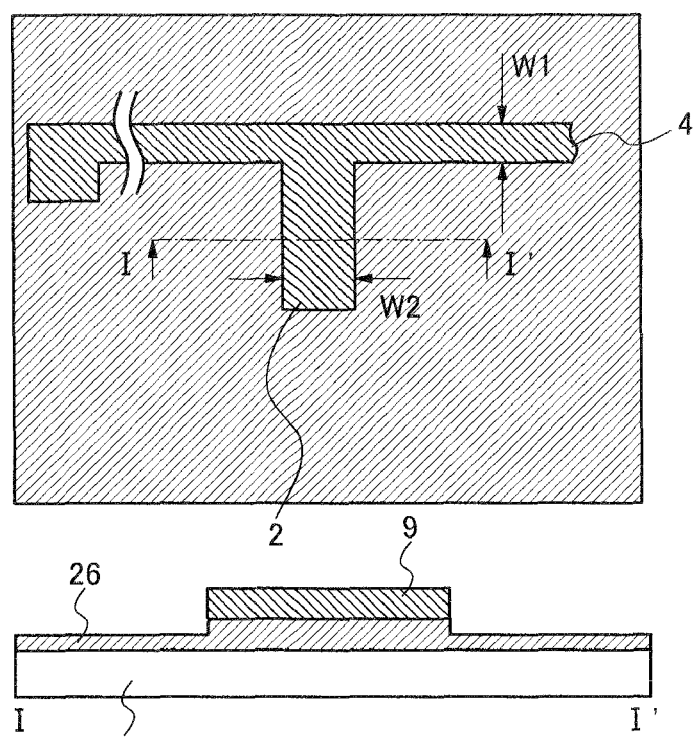
FIG. 4A is a plan view showing the fifth exemplary embodiment of the present invention.
Figure 4B:
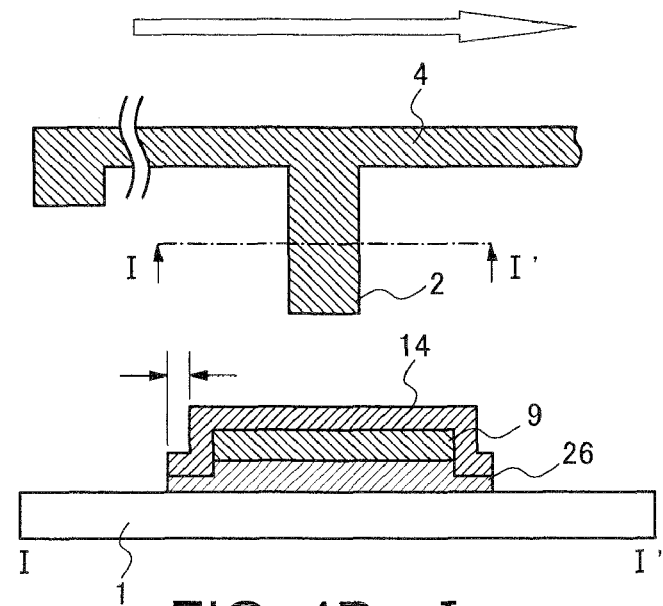

The fifth exemplary embodiment will be described referring to FIG. 4 taking the gate pattern formation process among manufacturing steps of the LCD device for instance. Each of FIG. 4A and FIG. 4B located on upper part of FIG. 4 is plan view of a TFT substrate, and FIG. 4A-I and FIG. 4B-I located on the lower part thereof are cross sectional views along I-I' lines shown in FIG. 4A and FIG. 4B, respectively.

First, after forming a Cr film 26 with 300 nm in thickness by the sputtering method on the insulating substrate 1 made of transparent substrate such as glass, the first resist pattern 9 is arranged by the photolithography method.

Next, only 150 nm in thickness of Cr film 26 is removed by the first etching using the etching method by using the first resist pattern 9 as a mask. The film thickness removed by the first etching is controlled by previously measuring time of the case where 300 nm thickness of Cr film is removed, and performing the first etching processing during only half of the measured time. More in detail, the first etching method is the wet etching using etchant of ceric ammonium nitrate system, the processing time is set with 85 seconds because previously measured time for removing all of Cr film 26 is 160 seconds with dead time concerned (FIG. 4A and FIG. 4A-I). The first resist pattern 9 is set such that a gate wiring width (indicated as "W1" in FIG. 4A) is 20 μm and a gate electrode width (indicated FIG. 4B) is 25 μm.

Next, the pre-transfer resist pattern, which is already formed into the desired pattern on the blanket, and the insulating substrate 1 are touched each other, and thereby transfer-printing the second resist pattern 14 such that it is overlapped with the gate pattern covered with the first resist pattern 9 and protruded therefrom, and the substrate is heated thereafter. The second resist pattern 14 covers the entire surface of the first resist pattern 9 and it is protruded from the first resist pattern 9 by 1.5 μm at right and left sides thereof.

In order to remove the Cr film 26 remained on the substrate, the second etching is performed by using the resist pattern as a mask to form the gate pattern (FIG. 4B and FIG. 4B-I). The second etching condition is determined such that its etchant is the same ceric ammonium nitrate system solution as the first etching, and the etching time is set to be 90 seconds with the excess etching time added.

Accordingly, edges of the gate pattern can be formed to have the stair-like forward tapered shape. After forming the gate pattern, the LCD device will be completed in the same method as the first exemplary embodiment (FIG. 4B and FIG. 4B-I).

Thus, according to this exemplary embodiment, after performing the first etching by using the first resist pattern as a mask, when overlapping the second resist pattern on the first resist pattern so as to be protruded by transfer-printing, and performing the second etching after it, the shape of the pattern edge after an etching can be made forward tapered shape like a staircase.

In a conventional technology such as the reflow by heating or chemical solution as described in the first related art and making the wiring to have forward tapered shape like the staircase by swelling as described in the second related art, the resulted resist expanse area after transformation depends on thickness (accurately, the volume) of the pre-transformed resist.

In another conventional technology such as tapering the wiring like staircase by the redevelopment and the ashing as described in the third related art, the resist area after transformation depends on the taper angle of the pre-transformed resist which is more difficult to be controlled than the resist area and thickness before transformation, because the pre-transformed resist area is determined by so-called isotropy etching.

On the other hand, however, according to this exemplary embodiment, there is a feature that the shape of the pattern edge after the etching can be highly stabilized with such a convenient method as a transfer-printing when it is compared with the above-mentioned related arts, because this exemplary embodiment depends only on a planar shape (the coating area) of the second resist pattern.

The Sixth Exemplary Embodiment

Next, the sixth exemplary embodiment will be described. It will be described by using the same gate pattern formation as in the fifth exemplary embodiment. The sixth exemplary embodiment is disclosed for a case where the present invention is applied to a laminated film.

Because the shape the size and the arrangement of the first resist pattern 9 and the second resist pattern 14 are the same as the fifth exemplary embodiment, this exemplary embodiment will be describe without referring to drawings.

First, Al—Nd alloy film and Mo—Nb alloy film are laminated and formed on the insulating substrate 1 with the thickness of 270 nm and 30 nm, respectively by using well-known sputtering method. Next, by using the first resist pattern 9 formed on the substrate as a mask, the first etching is performed to remove all the Mo—Nb alloy film.

As an example of etchant, such a mixed acid including the phosphoric acid, nitric acid and acetic acid, which is capable of etching the Al—Nd alloy film and the Mo—Nb alloy film together, is used. In this exemplary embodiment, although only the Mo—Nb alloy film by the first etching, the part of the Al—Nd alloy film may also be removed by the first etching in addition to the Mo—Nb alloy film if needed.

Next, the pre-transfer resist pattern, which is already formed into the desired pattern on the blanket, and the insulating substrate 1 are touched each other, and thereby transfer-printing the second resist pattern 14, and the substrate is heated thereafter. The second resist pattern 14 covers the entire surface of the first resist pattern 9 and it is protruded from the first resist pattern 9 by 1.5 μm at right and left sides thereof.

And the second etching is performed by using the same mixed acid including the same composition of the first etching with the above-mentioned resist pattern as a mask, and thus the Al—Nd alloy film is removed to reveal the insulating substrate 1.

Thus, the edge portions of the gate pattern can be formed to have the shape of forward tapered like staircase by performing it. After forming the gate pattern, the LCD device will be completed in the same manner as the first exemplary embodiment.

In this exemplary embodiment, the composition ratio of the first etchant and the second etchant can be changed, if needed. Taper angle of the pattern edge can be controlled in the desired value by changing its composition ratio.

Thus, according to this exemplary embodiment, even in the laminated film, after performing the first etching by using the first resist pattern as a mask, when overlapping the second resist pattern on the first resist pattern so as to be protruded by transfer-printing, and performing the second etching with the above-mentioned resist pattern as a mask after it, the shape of the pattern edge after an etching can be made the forward tapered shape like a staircase.

The Seventh Exemplary Embodiment

Figure 5A:
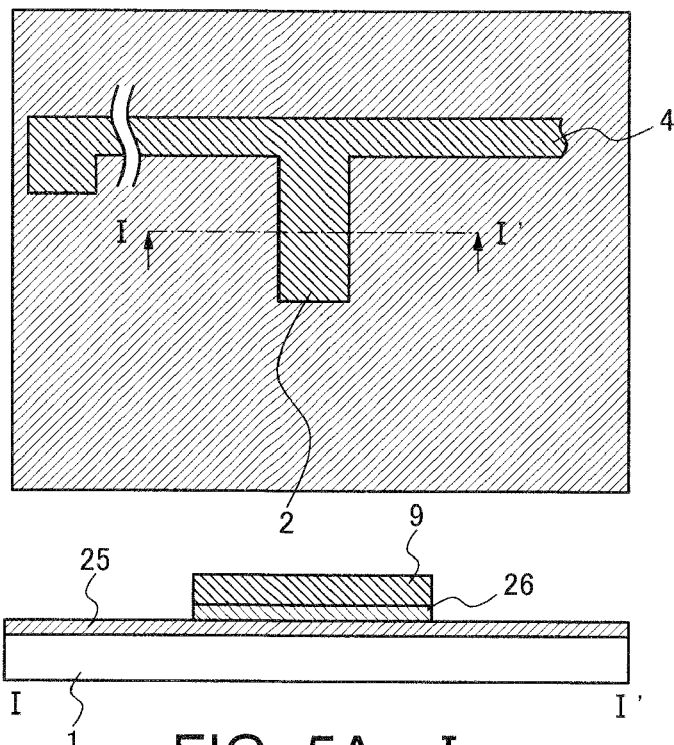
FIG. 5A is a plan view showing the seventh exemplary embodiment of the present invention.
Figure 5B:
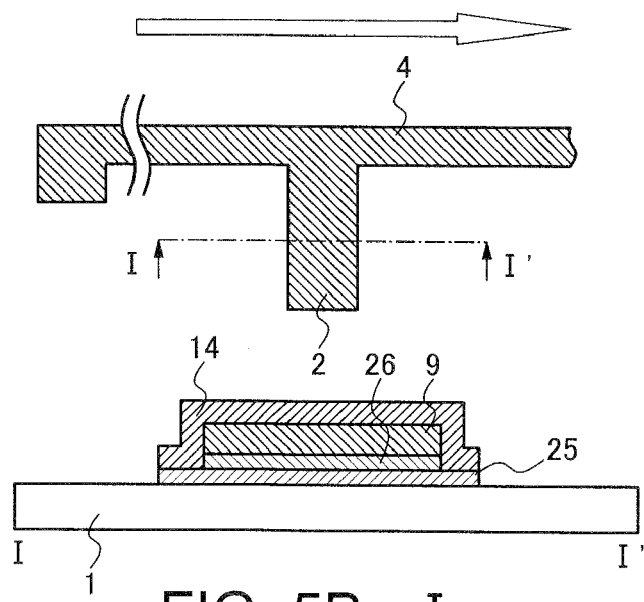

Next, the seventh exemplary embodiment will be described referring to FIG. 5. Each of FIG. 5A and FIG. 5B located on upper part of FIG. 5 is plan view of the TFT substrate, and FIG. 5A-I and FIG. 5B-I located on the lower part thereof are cross sectional views along I-I' lines shown in FIG. 5A and FIG. 5B, respectively.

In the sixth exemplary embodiment, although an etching of a laminated film is performed by using a similar chemical solution for the first etchant and the second etchant, the laminated film is etched by using different etchant in this exemplary embodiment.

First, after laminating an Al—Nd alloy film 25 and a Cr film 26 with the thickness of 270 nm and 30 nm, respectively, by the sputtering method on the insulating substrate 1 of the transparent substrate such as glass substrate, the first resist pattern 9 is formed so that the desired gate pattern may be formed by using the photolithography method. Then, the Cr film 26 is removed by the first etching using etchant of ceric ammonium nitrate system (FIG. 5A and FIG. 5A-I). The first resist pattern 9 is set to make a gate wiring width of 20 μm and a gate electrode width of 25 μm.

Next, the pre-transfer resist pattern, which is already formed into the desired pattern on the blanket, and the substrate 1 are touched each other, and thereby transfer-printing the second resist pattern 14 on the substrate, and the substrate is heated thereafter. The second resist pattern 14 covers the first resist pattern 9 and it is designed to be protruded from the first resist pattern 9 by 1.5 μm at right and left sides thereof.

After that, the second etching is performed by using a mixed acid including the phosphoric acid, nitric acid, and acetic acid with the above-mentioned resist pattern as a mask, to remove the Al—Nd alloy film 25 remained on the substrate, and thereby forming a forward tapered shape like a staircase on the gate wiring (FIG. 5B and FIG. 5B-I).

Thus, according to this exemplary embodiment, even in the laminated film for which an etching is difficult by one kind of etchant, the shape of the pattern edge after an etching can be made the forward tapered shape like a staircase by performing the second etching with the above-mentioned resist pattern as a mask by using other etchant different from the first etchant, after performing the first etching by using the first resist pattern as a mask and overlapping the second resist pattern on the first resist pattern so as to be protruded therefrom.

Although it has been explained in detail about the fifth exemplary embodiment through the seventh exemplary embodiment of the present invention, a configuration in detail is not limited to this exemplary embodiment and even if there is change or the like in the design in the range that does not deviate from a point of this invention, it is included in this invention.

The Eighth Exemplary Embodiment

Next, the eighth exemplary embodiment will be described referring to FIG. 6. Each of FIG. 6A and FIG. 6B located on the upper side of FIG. 6 indicate a plan view of a TFT substrate. FIGS. 6A-I through IV and FIGS. 6B-I through IV located on the lower part thereof are cross sectional views along lines of I-I' through IV-IV'. FIG. 6C-IV is an enlarged sectional view in an edge part shown in the FIG. 6C.

This exemplary embodiment simultaneously performs the data pattern formation method described in the first exemplary embodiment and technology which controls the cross-sectional shape of the etching pattern described in the fifth exemplary embodiment through seventh exemplary embodiment.

A point of difference between this exemplary embodiment and the first exemplary embodiment is an arrangement relation with the second resist pattern. Others are the same as that of the first exemplary embodiment. In the following, description will be made in view of different point of a technical idea between the first exemplary embodiment and this exemplary embodiment.

The insulating substrate 1, in which the semiconductor film 6 is exposed by the first etching using the first resist pattern 9 as a mask, and the pre-transfer resist pattern, which is already formed into the desired pattern on the blanket, are touched each other, and thereby transfer-printing the second resist pattern 14 on the substrate, and the substrate is heated thereafter.

The second resist pattern 14 is arranged such that it covers the channel portion and the drain electrode 10 and the source electrode 11 adjacent to the channel portion, respectively with overlapping width of 2 μm (designated as "a" in FIG. 6A-II). It covers the data wiring 13 with protruded width of 0.5 μm at both sides thereof (designated as "b" in FIG. 6A-IV), and it also covers the data terminal 12 with protruded width of 2 μm at both sides thereof (designated as "c" in FIG. 6A-III).

In this exemplary embodiment, when a channel width (designated by the letter "L" in FIG. 6A) of the TFT is 6 μm and the channel length (designated by the letter "W" in FIG. 6A) is 25 μm, the second resist pattern 14 is designed to have the size of 10 μm in the L direction and 25 μm in the "W" direction. The width (designated by the letter "D" in FIG. 6A) of data line 13 is 8 μm.

Next, a dry etching of PE system as the second etching using mixed gas of $HCl/SF_6/He/O_2$ is performed by using the above-mentioned resist patterns as a mask to reveal the gate insulation film 5 by removing the semiconductor film 6, and the island pattern 15 is formed (FIG. 6B and FIG. 6B-I through FIG. 6B-IV).

As to the shape of the edge formed by the data pattern and the semiconductor film after the etching process, although the data terminal 12 is forward tapered shape in stair-like, the data wiring 13 is the forward tapered shape without a flat part of semiconductor film (the shape by which a laminated film is forward tapered shape in an integrated manner) as shown in FIG. 6C-IV which is an enlarged view of an edge shown in FIG. 6C.

Thus, according to this exemplary embodiment, by arbitrarily controlling the protruding amount of the second resist pattern 14 arranged on the first resist pattern 9 for each protruding part, a flat distance at the pattern edge can be controlled in the desired length.

In the first through the third related arts, it is impossible to set and arrange the flat distance of the pattern edge for each part differently.

The reasons of being made such structure in this exemplary embodiment are as follows. In the data wiring section, by making the shape of wiring terminal into the integrated forward taper, the aperture ratio is secured. As for the data terminal part, the forward tapered shape in stair-like is provided in order to improve coating of the protective insulation film 16 in view of corrosion of the terminal metal which may be exposed to air, and partly because of design aspect, this part does not have to consider the aperture ratio and thus providing some degree of freedom on design. Because the apparent step becomes small by making the shape of the pattern edge to be the forward tapered shape in stair-like, coating of the protective insulation film 16 can be improved. And thereby improve the corrosion tolerance of the terminal metal.

Thus, according to the present invention, the protruding degree of the second resist pattern from the first resist pattern can be set arbitrarily and freely according to the need in the substrate surface.

By arbitrarily setting the amount of protruding region and performing the second etching, an arbitrary pattern can be formed such as stair-like or the integrated forward tapered shape with arbitrary length at the flat portion.

Since the methods of manufacturing the TFT substrate, the LCD panel and the LCD device, after forming the island pattern 15, are the same as in the first exemplary embodiment, the description of those methods are omitted here.

Although it has been explained in detail about the eighth exemplary embodiment of the present invention, a configuration in detail is not limited to this exemplary embodiment and even if there is change or the like in the design in the range that does not deviate from a point of this invention, it is included in this invention.

A content of the eighth exemplary embodiment of the present invention is that by arranging the second resist pattern on the first resist pattern by a transfer-printing method such that at least a part of it is extended to the extent that they are overlapped each other on the substrate which had been subjected to the first etching with the first resist pattern as a mask, and after that performing the second etching, and thereby making the cross sectional shape of the etched pattern into a forward tapered shape such as stair-like or integrated shape with various length at the flat portion.

Next, a first modification (modification one) of the eighth exemplary embodiment will be described referring to FIG. 7. Each of FIG. 7A and FIG. 7B located on the upper side of FIG. 7 indicates a plan view of the TFT substrate. Each of FIG. 7A-V and FIG. 7B-V on the lower part thereof indicates a cross sectional view along line of V-V' indicated on the plan view which is an intersection of the gate wiring 4 and the data wiring 13.

First, in the cross sectional views of FIG. 1 and FIG. 6 used for descriptions of the first and eighth exemplary embodiments, respectively, the surface of the gate insulation film 5 arranged on the gate pattern is illustrated with the flat shape for the purpose of easily understanding the invention without concerning the location of the gate pattern. In fact, however, when the gate insulation film 5 is formed on the gate pattern, its film surface shape reflects the convex shape of the gate pattern. Therefore, in FIG. 7, it is noted initially that its cross-sectional view is illustrated according to the actual condition, and the description of this exemplary embodiment will be made base on it.

A difference between the first exemplary embodiment and this exemplary embodiment is an arrangement relation of the second resist pattern. Others are the same as that of the first exemplary embodiment. Aiming at a technical point of difference between the first exemplary embodiment and this exemplary embodiment is described in detail.

A plan view of FIG. 7A indicates the state that the second etching in the first exemplary embodiment has been completed (it corresponds to a step of FIG. 1D). Referring to a cross sectional view along the line of V-V' portion (intersection of the gate wiring 4 and the data wiring 13) the vertical interval between the surface of the data wiring 13 and the surface of the gate insulation film 5 (it is indicated by "a" in FIG. 7A) is approximately equal to the summation of the film thickness of the gate wiring 4, the semiconductor film 6, the contact film 7 and the data wiring 13. In this exemplary embodiment, the vertical interval is about 830 nm when those film thicknesses are set as in the ordinary TFT such that the gate wiring 4 of 300 nm, and the semiconductor film 6 of 200 nm, the contact film 7 of 30 nm, and the data line of 300 nm.

In the manufacturing step of TFT, as mentioned above, although the protective insulation film 16 is arranged on the data pattern, the thickness of this protective insulation film 16 is about 150-250 nm.

Thus, because the step (830 nm) at the intersection of the gate wiring 4 and the data wiring 13 is as thick as several times of the thickness (150-200 nm) of the protective insulation film 16 arranged on it, there are a lot of technical problems in order to cover the step portion with the protective insulation film well.

When the LCD panel is droved under such condition that the coating on the intersection of the gate wiring 4 and the data wiring 13 with the protective insulation film 16 is insufficient, display unevenness occurs due to unevenness of ion distribution in the liquid crystal, and a defect such as wiring corrosion is caused by water slightly existed in the liquid crystal.

In order to resolve such problems, in this exemplary embodiment as shown in FIG. 7B and FIG. 7B-V, the second resist pattern 14 is arranged so as to be larger than the intersection area of the gate wiring 4 and data wiring 13 by 2 μm.

In this way, by arranging the second resist pattern 14 on the intersection of the gate wiring 4 and the data wiring 13, the vertical interval between the surfaces of the data wiring 13 and the gate insulation film 5 (it is indicated by "a" in FIG. 7B-V) is divided into the first vertical interval formed by the data wiring 13, the contact film 7 and the gate wiring 4 (it is indicated by "b" in FIG. 7B-V) and the second vertical interval formed by the semiconductor film 6 (it is indicated by "c" in FIG. 7B-V) and thus apparent vertical interval becomes small and thereby improving the coating of the protective insulation film.

The situation of the above-mentioned vertical interval is similar to a part of the gate electrode 2.

Therefore, in this exemplary embodiment, the second resist pattern, which covers the part of the first resist pattern arranged on the source electrode 11 and the drain electrode 10 and extends to the channel portion, is formed to be larger than the intersection of the source electrode 11 and the gate electrode 2, and the intersection of the drain electrode 10 and the gate electrode 2, by 2 μm, respectively, as shown in FIG. 7B and FIG. 7B-V.

By performing in this way, it is also possible to provide the forward tapered shape in stair-like at a part of the gate electrode 2, and thus the vertical interval of the intersection can be eased apparently.

Here, although the second resist pattern arranged on the intersection of the gate wiring 4 and the data wiring 13, the intersection of the source electrode 11 and the gate electrode 2 and the intersection of the drain electrode 10 and the gate electrode 2 is set to be larger than each of the above intersections by 2 μm, the second resist pattern can be set to be larger than each of the above intersection by 0.5 μm to form the integrated forward tapered shape as described in the eighth exemplary embodiment. By performing this, although the apparent vertical interval does not become small, the step coverage is improved.

As it has been described above, according to this exemplary embodiment, because an apparent step in the intersection can be eased when the second resist pattern 14 is arranged on the intersecting position of the gate pattern and the data pattern and protruded from the first resist pattern 9, coating of the protective insulation film 16 can be improved.

Although the first exemplary embodiment through the eighth exemplary embodiment (modification is included) have been described above, according to the present invention, it is possible to transfer-print the second resist pattern onto an insulating substrate with an arbitrary position, an arbitrary size and an arbitrary shape.

The second resist pattern that transfer-printed on an insulating substrate as explained in the first exemplary embodiment or the eighth exemplary embodiment (modification is included) can be formed by using either an offset printing represented by an relief printing or intaglio printing or a seal printing where a printing plate is provided with holes. When the seal printing method is used, those matters associated with the blanket described in the above mentioned example are excluded.

In a description of the first exemplary embodiment through the eighth exemplary embodiment (modification is included), although a case when the first resist pattern is formed using a well-known photolithographic method is disclosed, it may be arranged by using the transfer-printing used for forming the second resist pattern as well.

The first exemplary embodiment through the eighth exemplary embodiment (modification is included) can be combined and carried out appropriately.

In a description of the first exemplary embodiment through the eighth exemplary embodiment (modification is included), although it has been described focusing on an LCD device of TN system, it is not limited to the TN system, it can be applied to other LCD systems such as IPS system and VA system. Moreover, it is not limited to LCD device, but can be applied to a manufacturing method such as an electronic component.

Although the first exemplary embodiment through the eighth exemplary embodiment (modification is included) has been explained in detail, a configuration in detail is not limited to those exemplary embodiments, and even if there is change or the like in the design in the range that does not deviate from a point of this invention, it is included in this invention.

The Ninth Exemplary Embodiment

Figure 8:
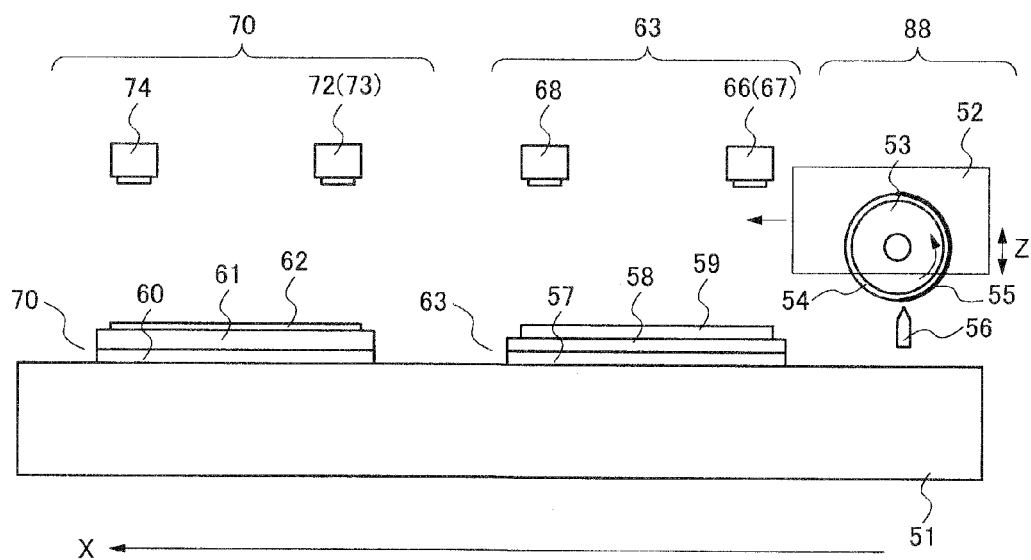
FIG. 8 is a cross sectional view of a relief reversal offset printer which indicates the ninth exemplary embodiment of the present invention.

Next, referring to FIG. 8 through FIG. 10, as the ninth exemplary embodiment, technology of transfer-printing the second resist pattern 14 on the substrate disclosed on the first exemplary embodiment through the eighth exemplary embodiment (including modification), and heating the printed substrate will be described in detail. A relief reversal offset printer used for this exemplary embodiment is shown in FIG. 8.

The printer used for the present invention includes printing stamp stage 63, a substrate surface plate part 70 and a resist coating part 88. The printing stamp stage part 63 includes a movable frame 52 which moves straight at least along a fixed frame 51 (the direction of the straight movement of this movable frame is made to be an X-axial direction), a cylinder-like blanket cylinder 53 installed on the direction vertical to the X-axial direction (make this direction to be the Y-axial direction, i.e. the depth direction of this drawing sheet), a blanket 54 wound around the blanket cylinder 53, and a coater 56 which extended in the Y-axial direction for forming a resist film 55 onto the blanket 54.

The printing stamp stage part 63 includes a second printing stamp stage 57 fixed on a fixed frame 51, a first printing stamp stage 58 (the change direction of the relative position is possible by total of five axial directions of X-direction, Y-direction, θ direction of the in-plain rotation of XY-direction, Z-direction vertical to the XY-direction, and the α direction of inclination direction of the XY-plane), a negative stamp (relief stamp for removing the resist ink film from the blanket) 59 fixed on the first printing stamp stage 58, and three of plate alignment apparatus 63-65 for performing a rough alignment of the negative stamp 59.

The substrate surface plate part 70 is equipped with a second substrate surface plate 60 fixed on a fixed frame 51, a first substrate surface plate 61 (the change direction of the relative position is possible by total of five axial directions of X-direction, Y-direction, θ direction of the in-plain rotation of XY-direction, Z-direction vertical to the XY-direction, and the α direction of inclination direction of the XY-plane), a print substrate 62 fixed on the first substrate surface plate 61, and three of substrate alignment apparatus 73-74 for performing a rough alignment of the print substrate 62.

A series of processing step of this exemplary embodiment includes following steps:
1) aligning the negative stamp;
2) aligning the print substrate;
3) forming the resist ink film on the blanket;
4) forming the pre-transfer resist pattern on the blanket surface by contacting the resist ink film and negative stamp;
5) transfer-printing the second resist pattern 14 on the print substrate by contacting the pre-transfer resist pattern formed on the blanket surface and the print substrate; and
6) heating the substrate.

A series of steps will be described in order.

Figure 9A:
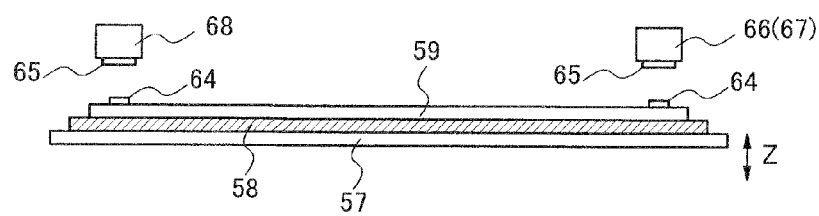
FIG. 9A is a side view of the printing stamp stage part of the relief reversal offset printer which indicates the ninth exemplary embodiment of the present invention.
Figure 9B:
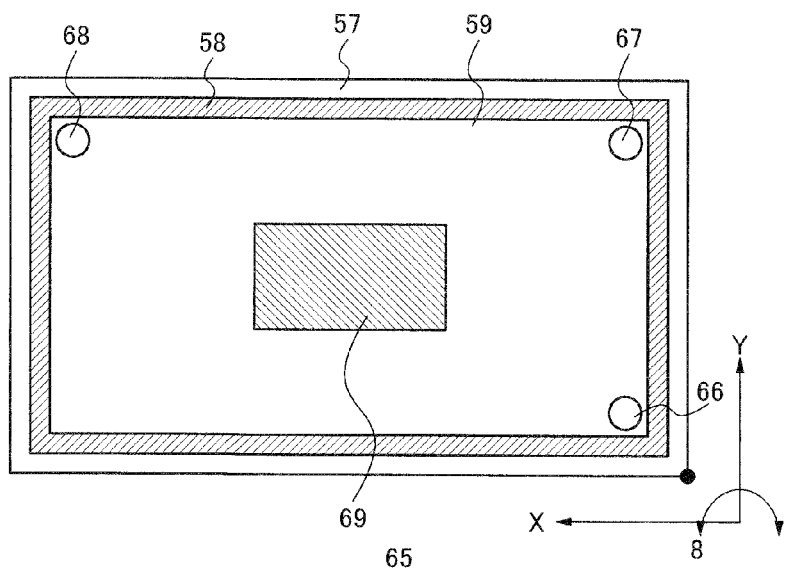
FIG. 9B is a plan view of the printing stamp stage part shown in FIG. 9A.

1) Alignment step of negative stamp:

An alignment step of a plate and a printing stamp stage will be described referring to FIG. 9A, FIG. 9B and FIG. 9C. FIG. 9A is a side view of the printing stamp stage part 63 shown in FIG. 8, and FIG. 9B is its top view, and FIG. 9C indicates the pattern of the alignment marker. The negative stamp 59 is fixed on the first printing stamp stage 58 having large size such that the entire surface of the negative stamp 59 is located thereon. A fixation method of the negative stamp 59 and the first printing stamp stage 58 is performed by cutting a concave slot into the printing stamp stage and connecting the slot to the vacuum system (not shown).

On the negative stamp 59, concave and convex patterns are provided such that the concave pattern corresponds to the portion of the second resist pattern 14 to be transfer-printed on the print substrate 62 while the convex pattern corresponds to the portion not to be transfer-printed. A soda-lime glass of the mask grade is used as the negative plate 59, with the size of 500 mm in the X-direction, 400 mm in the Y-direction, and 4.8 mm in the Z-direction (thickness-direction). The negative stamp 59 is manufactured by forming a Cr film on the entire surface of the above-mentioned soda-lime glass plate, applying a resist on it, selectively removing the resist by using a laser to form a removed pattern corresponding to the second resist pattern, etching the Cr film by using the resist as a mask, stripping the resist, etching the glass plate by using the Cr as a mask to form a concave pattern with depth of 6 μm, and after that, removing the Cr film by etching to provide the negative stamp 59.

The plate alignment apparatus 66-68 are well-known apparatus which are provided to decide the installation position of the plate using a camera image. Each of these plate alignment apparatus is provided with a camera which recognizes an image, a camera side alignment marker 65 placed in front of the camera, and the control mechanism part (not shown) that moves the first printing stamp stage 58 based on an image recognized with the camera. As shown in FIG. 9B, two remote side plate alignment apparatus 67 and 68 and a near side plate alignment apparatus 66 are connected to the fixed frame 51 respectively.

Each plate side alignment marker 64 is provided on three positions of the negative stamp 59, and each camera side alignment marker 65 is provided on the plate alignment apparatus 66-68, so that opposing two markers are arranged to satisfy a predetermined positional relationship.

Further, it is preferable to form a plate side alignment marker as a concave pattern on the negative stamp. By forming it into the concave pattern, the above-mentioned alignment marker can be transfer-printed onto the substrate. Accordingly, the third exemplary embodiment can be put into effect.

Figure 9C:
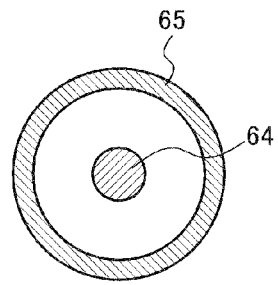
FIG. 9C is an expanded plan view of an alignment marker shown in FIG. 9B.

And as shown in FIG. 9C, and alignment of negative stamp 59 is performed by moving an axis of the printing stamp stage 58 so that the plate side alignment marker 64 is located at the center position of the camera side alignment marker 65. Thus, by aligning the negative stamp 59, the position of the negative stamp 59 to the apparatus can be determined.

The plate side alignment marker forming a counterpart of the camera side alignment marker of the remote side plate alignment apparatus 67 and the plate side alignment marker forming a counterpart of the camera side alignment marker of the near side plate alignment apparatus 66 are located on the same position in view of a direction of X-axis. The plate side alignment marker forming a counterpart of the camera side alignment marker of the remote side plate alignment apparatus 67 and the plate side alignment marker forming a counterpart of the camera side alignment marker of the plate alignment apparatus 68 are located on the same position in view of a direction of Y-axis. Those alignment markers are arranged outside the TFT pattern part 69 which is to be turned into an LCD panel later.

Thus, by arranging the plate side alignment marker on three positions of the negative stamp 59, alignment can be performed in the directions of X-axis, Y-axis and θ-axis. By arranging the alignment markers outside a TFT pattern part 69, the alignment difference in the TFT patterns can be made small when the resist pattern is arranged on the substrate. Therefore, the resist pattern can be transfer-printed on the print substrate 62 with high location accuracy. Although the three alignment markers are used in the above example, more than three markers are available.

Figure 10A:
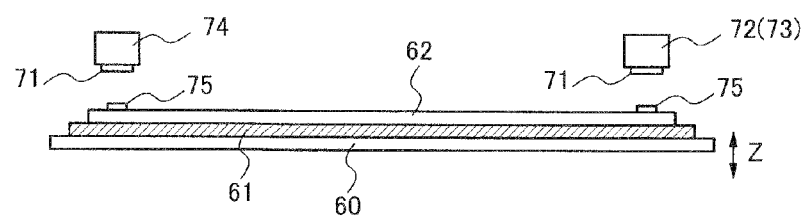
FIG. 10A is a sectional side view of the substrate surface plate part of the relief reversal offset printer which indicates the ninth exemplary embodiment of the present invention.
Figure 10B:
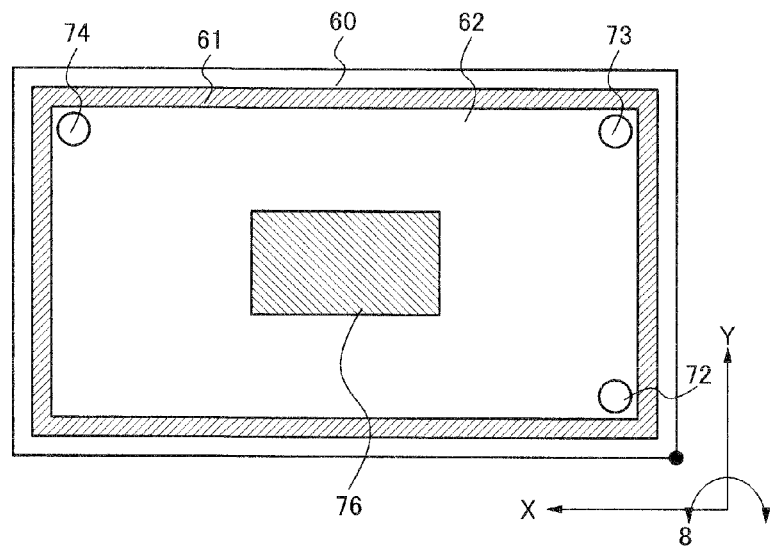
FIG. 10B is a plan view of the substrate surface plate part shown in FIG. 10A.

2) Alignment step of a print substrate:

A description of alignment of a print substrate 62 and a substrate surface plate will be described referring to FIG. 10A, FIG. 10B and FIG. 10C. FIG. 10A is a side view of the substrate surface plate part 70 in FIG. 8, and FIG. 10B is the top view, and FIG. 10C indicates the alignment marker pattern. A print substrate 62 is fixed on a substrate surface plate 61. A substrate surface plate 61 has the size larger than the print substrate 62, and the entire surface of the print substrate 62 is arranged on the substrate surface plate 61. A fixation method of the print substrate 62 and the substrate surface plate 61 performs by cutting a concave slot into the printing stamp stage and connecting the slot to the vacuum system (not shown). An alkaline-free glass substrate is used as the print substrate 62, with the size of 470 mm in the X-direction, 360 mm in the Y-direction, and 0.7 mm in the Z-direction (thickness).

The substrate alignment apparatus 72-74 are well-known apparatus which are provided to decide the installation position of the print substrate using a camera image. Each of these substrate alignment apparatus is provided with a camera which recognizes an image, a camera side alignment marker 71 placed in front of the camera, and the control mechanism part (not shown) that moves the first substrate surface plate 61 based on an image recognized with the camera. As shown in FIG. 10B, two remote side substrate alignment apparatus 73 and 74 and a near side substrate alignment apparatus 72 are connected to the fixed frame 51 respectively.

The near side substrate alignment apparatus 72 and the near side plate alignment apparatus 66, the remote side substrate alignment apparatus 73 and the remote side plate alignment apparatus 67, and the substrate alignment apparatus 74 and the plate alignment apparatus 68 should be made the same arrangement to the print substrate, respectively.

Each substrate side alignment marker 75 is provided on three positions of the print substrate 62, and each camera side alignment marker 71 is provided on the substrate alignment apparatus 72-74, so that opposing two markers are arranged to satisfy a predetermined positional relationship.

This substrate side alignment marker 75 can use a marker formed by either an arbitrary layer or the first resist pattern 9 prior to the second resist pattern 14 is transfer printed. However, in this exemplary embodiment, the first resist pattern 9 is used as the substrate side alignment marker. When employing the first resist pattern 9 as an alignment marker, the location accuracy of the print is improved because it can be directly arranged with the second resist pattern 14.

In this way, the third exemplary embodiment (refer to FIG. 3) can be made practical use.

Figure 10C:
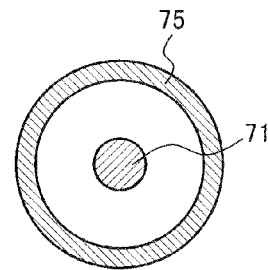
FIG. 10C is an expanded plan view of an alignment marker shown in FIG. 10B.
Figure 11A:
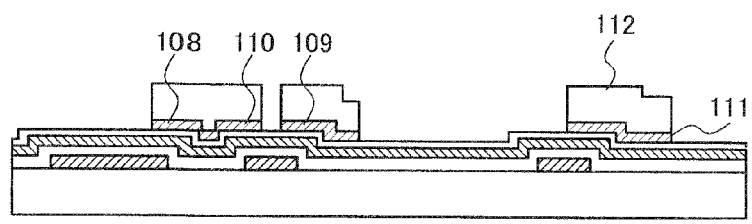
FIGS. 11A to 11C are cross sectional views which indicate steps of a manufacturing an inverted-stagger type TFT for describing an example the first conventional example, respectively.
Figure 11B:
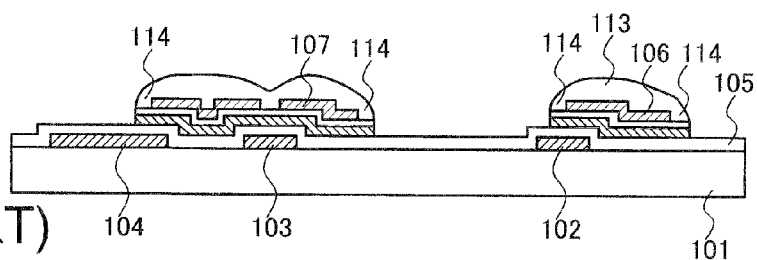
Figure 11C:
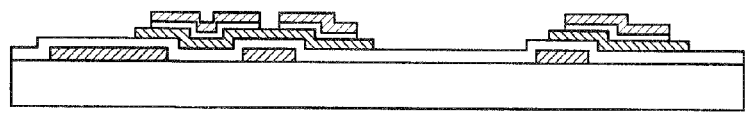
Figure 12A:
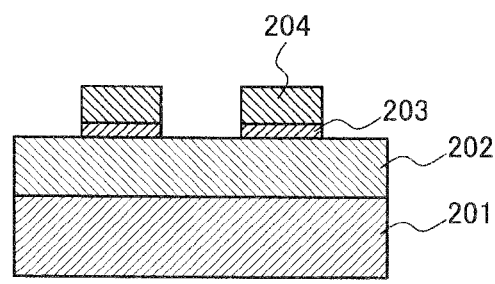
FIGS. 12A to 12C are cross sectional views showing steps of a manufacturing step for describing the third conventional example.
Figure 12B:
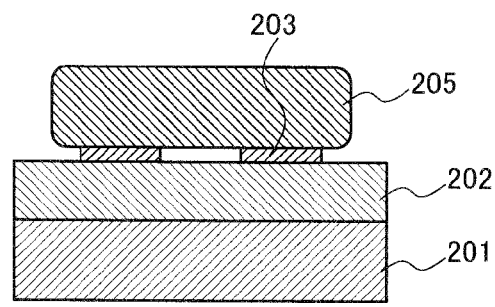
Figure 12C:
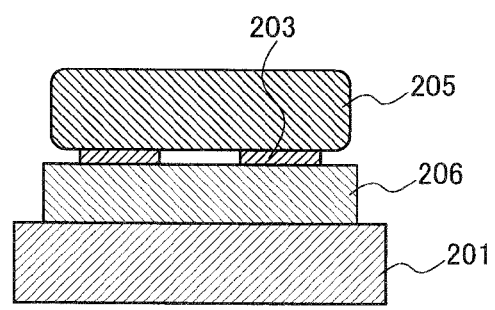
Figure 13A:
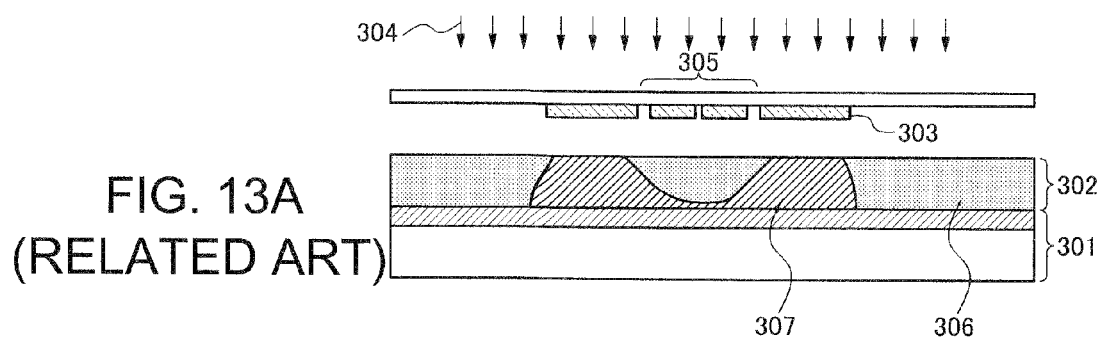
FIG. 13A and FIG. 13B are cross sectional views illustrating steps of an exposure which controlled the light transmittance in three stages in the fourth conventional example.
Figure 13B:
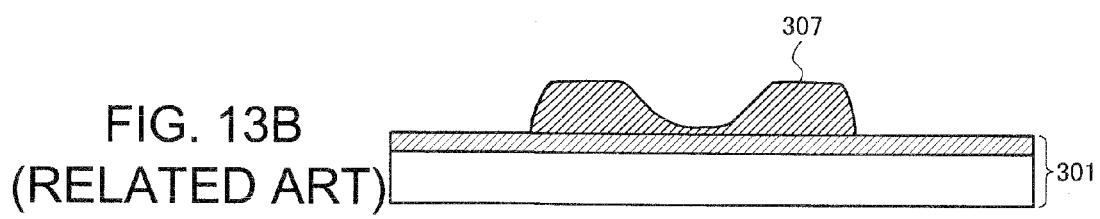
Figure 14A:
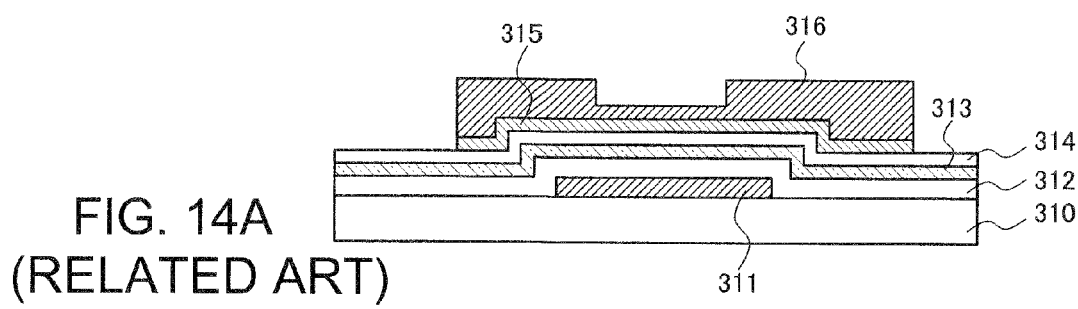
FIGS. 14A to 14C are cross sectional views showing steps of a manufacturing an inverted-stagger type TFT for describing the fourth conventional example.
Figure 14B:
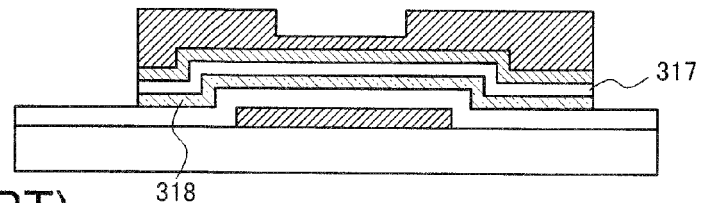
Figure 14C:
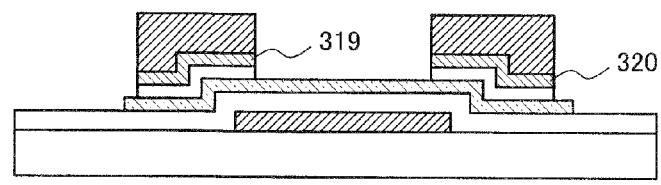
Figure 15A:
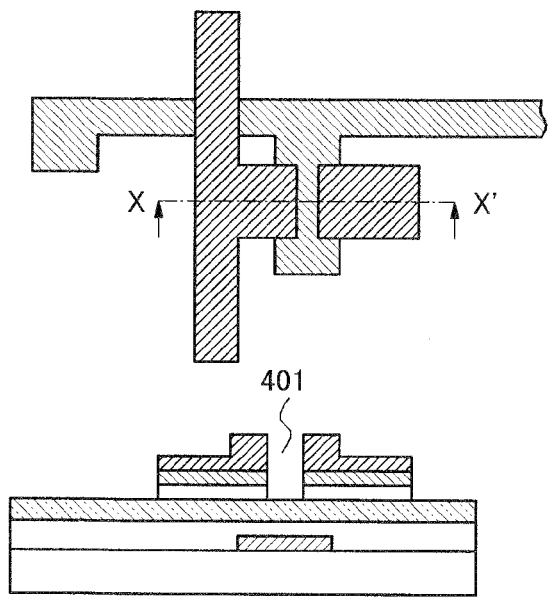
FIG. 15A is a plan view showing one step of manufacturing an inverted-stagger type TFT for describing difference between the sixth conventional example and the second conventional example.
Figure 15A:
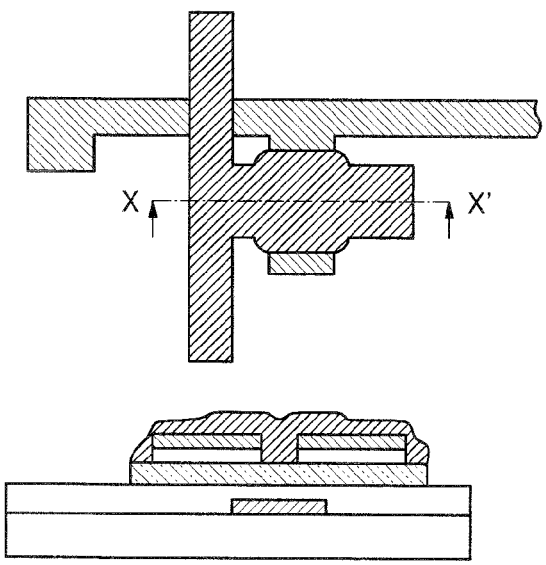
Figure 16A:
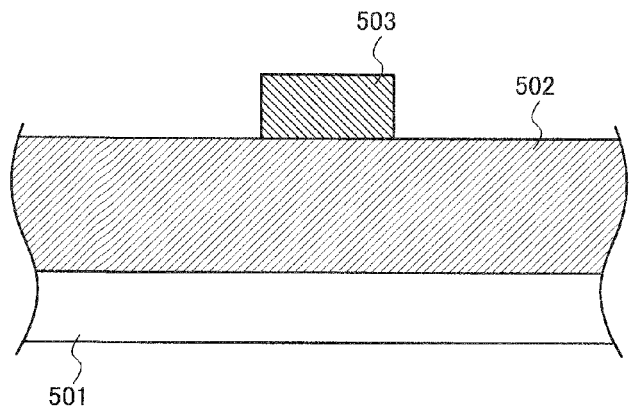
FIGS. 16A to 16C are cross sectional views illustrating steps for a wiring shape control of the second conventional example.
Figure 16B:
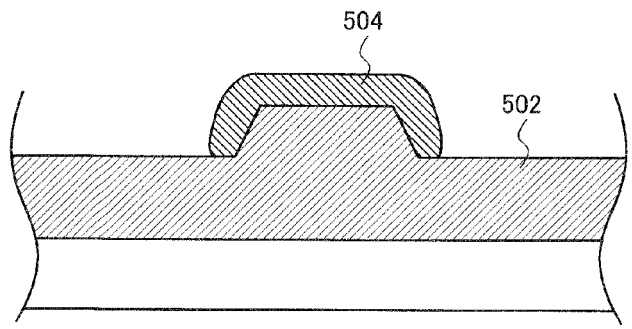
Figure 16C:
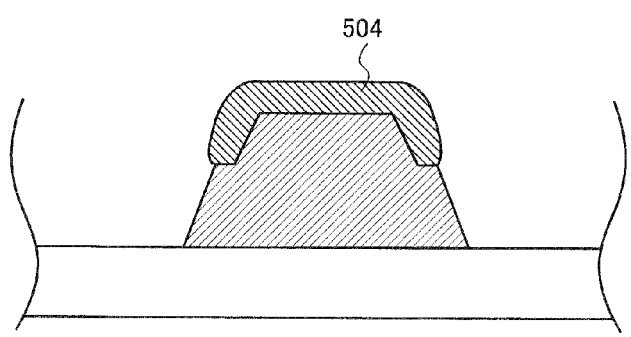
Figure 17A:
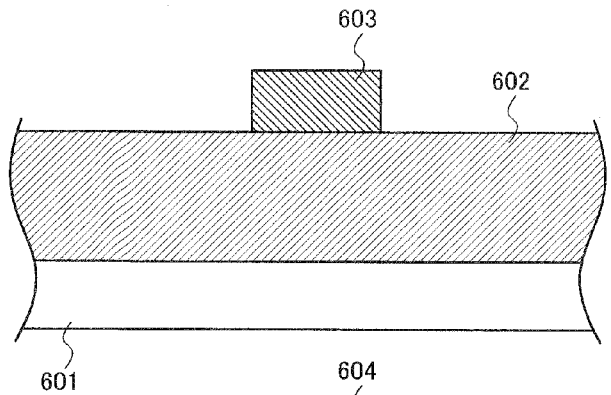
FIGS. 17A to 17C are cross sectional views illustrating steps for a wiring shape control of the third conventional example.
Figure 17B:
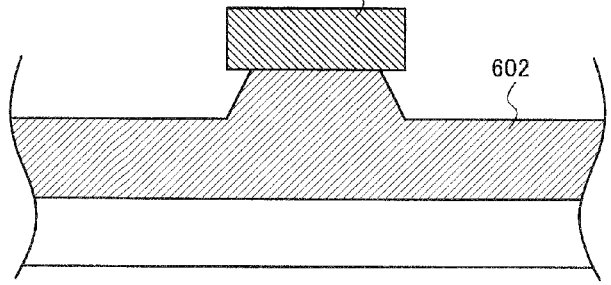
Figure 17C:
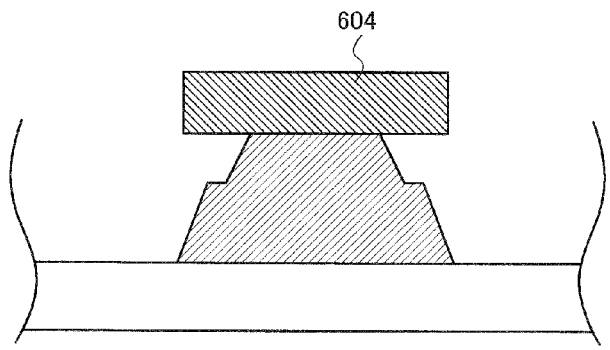
Figure 18A:
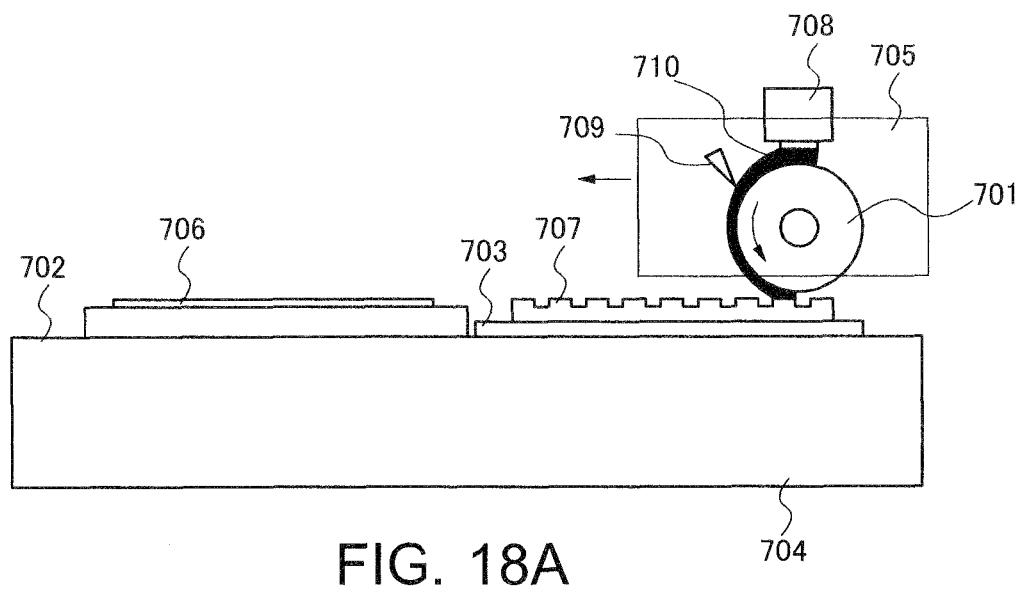
FIG. 18A is a conceptual diagram showing the whole apparatus for describing the seventh conventional example.
Figure 18B:
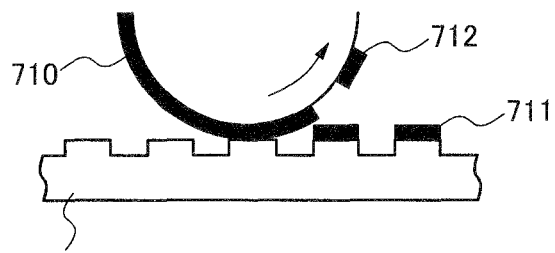
FIG. 18B is an expansion conceptual diagram showing a corresponding relationship between a blanket and stamp of FIG. 18A.
Figure 18C:
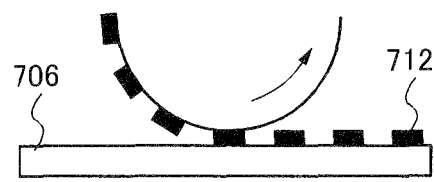
FIG. 18C is an expansion conceptual diagram showing a corresponding relationship between a blanket of FIG. 18B and a glass substrate of FIG. 18A.
Figure 19A:
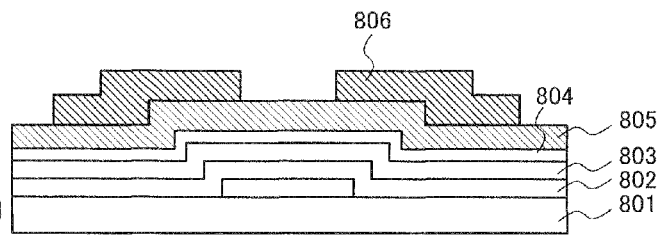
FIGS. 19A to 19D are cross sectional views showing steps of a manufacturing step an inverted-stagger type TFT for describing the ninth conventional example.
Figure 19B:
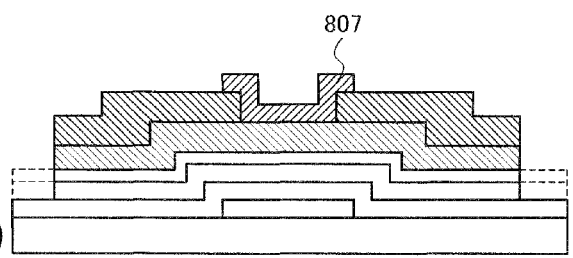
Figure 19C:
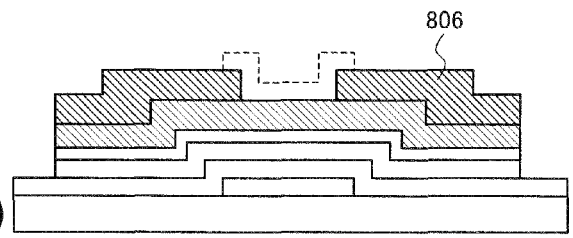
Figure 19D:
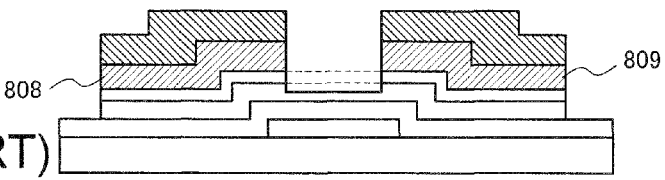

The substrate surface plate 61 is moved, and as shown in FIG. 10C, alignment of the print substrate 62 is performed so that the substrate side alignment marker 75 and the camera side alignment marker 71 are adjusted each other. The position of the print substrate 62 to an apparatus is determined in this way.

The substrate side alignment marker forming a counterpart of the camera side alignment marker of the remote side substrate alignment apparatus 73 and the substrate side alignment marker forming a counterpart of the camera side alignment marker of the near side substrate alignment apparatus 72 are located on the same position in view of a direction of X-axis. The substrate side alignment marker forming a counterpart of the camera side alignment marker of the remote side substrate alignment apparatus 73 and the substrate side alignment marker forming a counterpart of the camera side alignment marker of the substrate alignment apparatus 74 are located on the same position in view of a direction of Y-axis. Those alignment markers are arranged outside the TFT pattern part 76 which is to be turned into an LCD panel later.

Thus, by arranging the substrate side alignment marker on three positions of the print substrate 62, alignment can be performed in the directions of X-axis, Y-axis and θ-axis. By arranging the alignment markers outside a TFT pattern part 76, the alignment difference in the TFT patterns can be made small when the second resist pattern is arranged on the substrate. Therefore, the resist pattern can be transfer printed on the print substrate 62 with high location accuracy. Although the three alignment markers are used in the above example, more than three markers are available.

In order to secure printing precision, the height of the surface of the negative stamp 59 fixed on a printing stamp stage 58 and the print substrate 62 fixed on the substrate surface plate 61 are made same, and better printing precision can be secured.

3) Step of forming a resist ink film on the blanket:

A coater 56 used by the present invention is a capillary (CAP) coater which is elongated and installed in the Y-axis direction. The CAP coater length is made 350 mm. The cap of the CAP coater is made to have a width by which about 0.2 mm of resist ink rises by a capillary phenomenon. And blanket cylinder 53 installed in the movable frame 52 is descended in the Z-axis direction to contact with the resist ink. After that, the blanket cylinder 53 is raised by about 0.4 mm to form a bead of the resist between the blanket 54 and the cap. Next, blanket cylinder 53 is rotated with the rate of the 20 mm/sec by the moving speed of the blanket surface, and a resist ink film 55 is formed on the blanket 54. The bead is destroyed by moving up the cap more after the resist ink film formation. And the resist ink film 55 formed on the blanket is left for one minute to evaporate a solvent, to provide the degree of thixotropy thereof such that its shape is held at the time of image pull-out. The resist ink used here is novolac resin, and the photosensitivity is not given, and the viscosity is 10 cp and composition is made of resin: PGMEA (1-methoxy-2-propyl acetate):IPA(Isopropyl Alcohol)=15 wt %:25 wt %:60 wt %. The blanket 54 is made of a silicon resin.

4) Step of forming a pre-transfer resist pattern on the blanket surface by contacting the resist ink film and the negative stamp (step of image pull-out):

A movable frame 52 is moved to an image pull-out starting position and the blanket cylinder 53 is also rotated to reach the image pull-out starting position and thereby making it starting point of the image pull-out. Next, the blanket cylinder 53 is descended in the Z-axial direction to the position where a nip width of the negative stamp 59 and a blanket 54 becomes to be 10 mm. And forming a pre-transfer resist pattern on the blanket 54 by contacting the negative stamp 59 and the resist ink film 55 and moving them while keeping the moving speed of the movable frame 52 and the rotating speed of the surface of the blanket 54 same. After that, the blanket cylinder 53 is raised in the Z-axis direction to the position that does not touch the negative stamp 59.

It is preferable that both moving speeds of the surface of the blanket 54 are the same in both of the image pull-out process and the resist ink film forming process.

Thus, the resist ink film 55 formed on the blanket 54 is produced with equal period on every location of the blanket during the resist ink film formation process through the image pull-out process.

By making both the process periods equal in this way, the stable pattern can be formed on the blanket 54, because the dryness condition (the degree of thixotropy) of the resist ink film 55 is the same in every position.

In this exemplary embodiment, the moving speed of the surface of the blanket 54 is 20 mm/sec.

5) Step of forming a pre-transfer resist pattern on the blanket surface by contacting the resist ink film and the print substrate (step of transfer-printing):

A movable frame 52 is moved to a transfer-printing starting position and the blanket cylinder 53 is also rotated to reach the transfer-printing starting position and thereby making it a starting point of the transfer-printing. The positional relationship between the transfer-printing starting point and the starting point image pull-out is stored in a control system of the apparatus. And since the substrate positions of the negative stamp 59 and the print substrate 62 are determined by alignment, respectively, the first resist pattern 9 formed on the print substrate 62 and the second resist pattern 14 can be overlapped. Next, the blanket cylinder 53 is descended in the Z-axial direction to the position where a nip width of the negative stamp 59 and a blanket 54 becomes to be 10 mm.

And forming a pre-transfer resist pattern on the blanket 54 by contacting the print substrate 62 and the resist ink film 55 and moving them while keeping the moving speed of the movable frame 52 and the rotating speed of the surface of the blanket 54 same. After that, the blanket cylinder 53 is raised in the Z-axis direction to the position that does not touch the print substrate 62. The moving speed of the surfaces of the blanket 54 is made 20 mm/sec here.

It is preferable that both moving speeds of the surface of the blanket 54 are the same in both of the image pull-out process and the resist pattern transfer-printing process.

Thus, the pre-transfer resist pattern formed on the blanket 54 is produced with equal process period in every location of the blanket after the image pull-out to the substrate transfer-printing.

By making the process period equal, the stable pattern can be formed on the substrate, because the dryness condition (the degree of thixotropy) of the pre-transfer pattern is the same in every position.

Next, a decision procedure in the image pull-out direction and the transfer-printing direction for getting a good transfer-printed pattern will be described.

The good resist pattern can be arranged on the print substrate by selecting following decision making items (1) to (3) with its order of priority for the direction of the image pull-out and transfer-printing.

A reason of such order of priority is that it is difficult to form a small pattern in a printing direction of the offset printing.

(1) In the case of that a transfer pattern includes a narrow pattern having less than 10 μm width, on the basis of the longest pattern among those narrow patters having no more than 10 μm width, the image pull-out and the transfer-printing are performed by arranging the image pull-out direction and the transfer-printing direction so as to be the same direction of the elongated direction of the longest pattern.

(2) In the case of that a transfer pattern does not include a pattern having no more than 10 μm width, on the basis of the longest pattern among those patters having no more than 30 μm width, the image pull-out and the transfer-printing are performed by arranging the image pull-out direction and the transfer-printing direction so as to be tilted at about 20 degrees from the direction of the elongated direction of the longest pattern.

(3) In the case of that a transfer pattern does not include a pattern having no more than 30 μm width, on the basis of the longest pattern regardless of its width size, the image pull-out and the transfer-printing are performed by arranging the image pull-out direction and the transfer-printing direction so as to be tilted at about 45 degrees from the direction of the elongated direction of the longest pattern.

The image pull-out direction and the transfer-printing direction to be determined are related to following elements: [1] the shearing force caused by resist material and its film thickness and the rotating speed of the blanket cylinder, [2] in the image pull-out process, a power relationship between the adhesion power of the negative stamp to the resist and the adhesion power of the resist to the blanket, and in the transfer-printing process, a power relationship between adhesion power of the resist to the blanket and adhesion power of the print substrate to the resist.

However, because a solvent is evaporated from the resist with time, it is impossible to measure the above-mentioned adhesion and the elasticity and it could not be digitized. Thus the decision procedure as mentioned above is decided an empirical rule.

The above-mentioned empirical rule was decided by this inventor by varying following various factors: varying the kind of resists such as a novolac resin, an acrylic resin, and a mixture of the novolac resin and the acrylic resin; varying the resin density of the resist in the range of 10-30 wt %; varying the resist film thickness in the range of 0.5 μm-1.5 μm; varying the moving speed of the surface of the blanket 54 in the range of 15-50 mm/sec, varying material of the convex portion of the negative stamp with either glass or Cr; and varying the nip in the range of 7-20 mm which is formed with the blanket, the negative stamp and the print substrate at the time of the image pull-out and the transfer-printing.

For example, the direction of the image pull-out process or the transfer-printing process for the second resist pattern 14 should be performed in the same direction of the channel width "W" direction as designated by a large white arrow shown in FIG. 1D of the first exemplary embodiment. In the second exemplary embodiment, as indicated by the large white arrow in FIG. 2B, the desired direction of those processing is along the elongating direction of the data line like the first exemplary embodiment. In the fifth exemplary embodiment, as indicated by the large white arrow in FIG. 4B, although the desired direction of those processing is along the elongating direction of the gate line, that is, the direction vertical to the elongating direction of gate electrode, it is better to tilt the substrate in view of the above-mentioned order of priority. In the eighth exemplary embodiment, as indicated by the large white arrow in FIG. 6B, the desired direction of those processing is along the elongating direction of the data wiring. In the modification one of the eighth exemplary embodiment, as indicated by the large white arrow in FIG. 7B, the desired direction of those processing is along the elongating direction of the data line.

6) Step of heating the print substrate:

A print substrate on which the second resist pattern had been transfer-printed is heated for 5 minutes 120° C., to dry the resist by evaporating solvent therein. The film thickness of the resist pattern 14 after dryness is 1.0 μm. By this drying process, an adhesion between the resist film and a ground film is also improved.

In this exemplary embodiment, since the resist pattern is formed by the transfer-printing, the used resist material is not given the photosensitivity, but the photosensitive resin can be also used.

In this exemplary embodiment, the first resist pattern is formed by using a well-known photolithographic method, and thus the positive type novolac resin having the photosensitivity is used. As for the second resist pattern, non-photosensitive novolac resin is used.

After the substrate provided with the second resist pattern is heated with the above-mentioned condition immediately after the transfer-printing, the print substrate is broken for inspection, and thereby a boundary is confirmed between the first resist pattern and the second resist pattern after that.

However, when the substrate provided with the second resist pattern is heated with the above-mentioned condition after leaving it for 2 minutes after the transfer-printing, the print substrate is broken for inspection, and thereby no such boundary is confirmed between the first resist pattern and the second resist pattern.

Regarding such two kinds of dried print substrate 62, although a sample (FIG. 1D and FIG. 1D-I through III) described in the first exemplary embodiment is treated with etchant of ceric ammonium nitrate system for 180 seconds, the special difference is not confirmed in the etching configuration therebetween. Then, the similar etching treatment is performed for 500 seconds and observed as well.

As a result, a wedge-like abnormal etching configuration was confirmed in an overlapped boundary section between the first resist pattern and the second resist pattern in a sample which was heated immediately after a transfer-printing. Such an abnormal etching configuration is presumed to be derived from adhesiveness between the first resist pattern and the second resist pattern.

Therefore, it is desirable to select the material and process condition such that the resist material for the first resist pattern is formed to be mixed with the resist material for the second resist pattern.

In this case, it is preferable to mix the first resist pattern material and the second resist pattern material in such a manner that both resist material are slightly mixed to the extent that the phase boundary of the two resist material is not distinguished while keeping the shape of the second resist pattern so as not to be collapsed. Accordingly, both pattern materials are not necessary to be similar resist resin, but may be, for example, such combination of the novolac resin and acrylic resin, or a mix of epoxy and polyimide or the like are available.

It is desired naturally in the resist material that etching resistance is high. Since the first resist pattern is exposed to at least twice of etching in particular, it is better for the resistance to etching to be high compared with the second resist pattern material.

In this exemplary embodiment, although a case when the first resist pattern is provided by using a well-known photolithography, the first resist pattern may also be provided by using the transfer-printing as well as the second resist pattern.

In order to improve a resistance to etching, the thermosetting property or the photosetting property may be given to the resist material. When the thermosetting property or the photosetting property is given, an adhesion of resist material with the substrate improves, and the good pattern can be formed after the etching process.

The novolac resin has a high film characteristic (the film density is sparse). On the other hand, an acrylic resin has the property that it enters between the molecules of novolac resin. Accordingly, by adding acrylic resin into the novolac resin to make a blend material, the film density improves and the resistance to etching can be improved.

In this exemplary embodiment, the near side substrate alignment apparatus 72 and the near side plate alignment apparatus 66, the remote side substrate alignment apparatus 73 and the remote side plate alignment apparatus 67, and the substrate alignment apparatus 74 and the plate alignment apparatus 68 are made the same arrangement to the print substrate, respectively. Further, because the plate side alignment marker 64 is transfer-printed on the print substrate 62, and the substrate side alignment marker 75 is made the first resist pattern, when the transfer-printing position of the second resist pattern is correct, the first resist pattern is located outside and the second resist pattern is located at the center thereof. The arrangement relation with the second resist pattern to the first resist pattern can be confirmed by observing this state. The transfer-printing location accuracy of the second resist pattern to the first resist pattern can be improved by reflecting such observations of the above-mentioned arrangement relation in an apparatus as offset value in the image pull-out starting point or the transfer-printing starting point.

Regarding the first exemplary embodiment through the fifth exemplary embodiment and the eighth exemplary embodiment, because the gate pattern is already formed on the print substrate 62, alignment of the print substrate 62 is performed by using the substrate side alignment marker provided by using a gate layer.

When transfer-printing the first resist pattern and the second resist pattern for the same direction toward the substrate by using the same relief reversal offset printer, the distortion of the pattern caused by direct advance or the like of the fixed frame can be ignored, and the superposition accuracy of the first resist pattern and the second resist pattern can be improved.

Furthermore, by transfer-printing the first resist pattern and the second resist pattern by using the same position of the blanket cylinder, the distortion of the pattern caused by the roundness or the like of the blanket cylinder can be ignored. And by transfer-printing by using the same position of the same blanket, the distortion caused by the roundness or the like by thickness variation of the blanket can also be ignored. The superposition accuracy can be improved further in this way.

Although it has been explained in detail about the relief reversal offset printer by a description of the ninth exemplary embodiment above, a configuration in detail is not limited to this exemplary embodiment, and even if there is change or the like in the design in the range that does not deviate from a point of this invention, it is included in this invention.

The present invention can be applied to offset printing in general. It can be applied to relief printing and intaglio printing or the like, for example.

The Tenth Exemplary Embodiment

Next, as the tenth exemplary embodiment, previous processing technology is described below, which is performed prior to the second resist pattern 14 is arranged after the first etching is completed.

This exemplary embodiment is intended to resolve such production issues for manufacturing faultless panel over an entire LCD panel surface which is becoming a large screen in recent years.

It is desirable that an adhesion between the second resist pattern 14 and either of the first resist pattern 9 or the pattern 14 the exposed base substrate is high.

In order to improve the adhesion, those treatments are made such as removing those damaged layers such as deterioration layer or deposit layer due to physical and/or chemical condition formed on the surface of the first resist pattern 9 and the surface of the exposed base substrate for cleaning, or performing an adhesion improving process without resorting the removal of the damaged layer.

First, a method to remove the damaged layer is to slightly etch the damaged layer formed on the first resist pattern 9.

In this exemplary embodiment, as is described in the second problem of the first related art, the damaged layer is not necessarily removed uniformly over an entire surface. In this exemplary embodiment, when a solvent contained in the resist which is dried to the extent that its shape is held though it contained the solvent, is removed by the degree that the solvent can enter from a gap of a remaining damaged portion, the boundary can be lost between the first resist pattern and the second resist pattern.

The pretreatment is made to the substrate, which the first etching in the first exemplary embodiment had been completed, by performing following process: removing process in slightly removing the first resist pattern including the damaged layer by shower performed for 30 seconds in 0.6% TMAH (slight etching), washing process in water, and drying process in $N_2$ blows. Then, the second resist pattern is transfer-printed by using a relief reversal offset printing, and heated at 120° C. for 5 minutes without the leaving time.

As a result of fracturing and observing samples, it is confirmed that the boundary of the first resist pattern and the second resist pattern becomes indistinct compared with the above-mentioned case which has no pretreatment, in every samples using either one of a novolac resin, an acrylic resin and a mixed resin of novolac resin and the acrylic resin.

Although TMAH is used in this exemplary embodiment as pretreatment solution, other etchant is available when the resist can be etched slightly. When a resist is composed of either one of novolac resin, an acrylic resin and a mixed resin ingredient of the novolac resin and the acrylic resin, a basic solution is available. As an example of the basicity solution in addition to TMAH, amine system solution and a hydroxylation alkali metal aqueous solution or the like is available.

When the basicity solution is mixed with the surfactant material, wettability between the resist and the pretreatment liquid is improved, and thereby enabling more efficient slight etching.

The slight etching is not limited to the wet etching system, but it may be a dry method using an ashing by $O_2$ gas or the like and a UV lamp or the like.

In order to improve the adhesion without resorting to such treatment as removal of the damaged layer and the surface cleaning, for example, it is better to expose the resist pattern to vapor of HMDS (Hexamethyl Disilazane) or the like

The Eleventh Exemplary Embodiment

Next, as the eleventh exemplary embodiment, an after-treatment will be described which is performed prior to the second etching after arranging the second resist pattern.

This exemplary embodiment is intended to resolve such production issues for manufacturing faultless panel over an entire LCD panel surface which is becoming a large screen in recent years.

In a relief reversal offset printing described in the ninth exemplary embodiment, the blanket and the print substrate are contacted when the second resist pattern is transfer-printed on the print substrate.

Ideally, although the resist does not adhere to the unnecessary region of the blanket, i.e., the resist pattern is transfer-printed only on the intended region, when the same blanket is used for many hours in mass production, a resist residue (floating sludge) with a thin film shape remains on the blanket, and the floating sludge is sometime transfer-printed on the print substrate.

Rarely, the resist causes a thread pull during image pull-out and the transfer-printed, and thus a thin filamentous resist is transfer-printed on those unnecessary parts (the error pattern). When such floating sludge and the error pattern are transfer-printed on the print substrate 62, the unneeded pattern will be formed.

In order to resolve the problem, the floating sludge and the error pattern should be removed prior to etching process for the resist pattern transfer-printed on the print substrate.

The floating sludge and the error pattern can be removed by the same processing of slightly etching the damaged layer described in the tenth exemplary embodiment.

Although it has been disclosed about additional technology after or before arranging the second resist pattern on the substrate in the description of the tenth exemplary embodiment and the eleventh exemplary embodiment above, a configuration in detail is not limited to this exemplary embodiment, and even if there is change or the like in the design in the range that does not deviate from a point of invention, it is included in this invention.

Although the present invention has been disclosed in the description of the first exemplary embodiment through the eleventh exemplary embodiment above, using a drawing according to the need, an additional explanation is made for the purpose of making the present invention clearer.

First, the definition of "the resist pattern" in the present invention is made clear. "The resist pattern" is defined as "the pattern (mask) that plays the role of protecting so that a lower layer film is not etched in a case when a film located in a lower layer with the resist pattern is etched," in the present invention. Therefore, after etching the lower layer film, removal of the resist pattern from the substrate by stripping is not necessarily required.

As an example of the resist pattern, not only organic resin material such as novolac resin, an acrylic resin and polyimide resin containing the above-mentioned organic solvent, but also the conductive ink material with solvent containing nanoparticle ink of gold, silver or nickel nanoparticles, or ITO paste.

Describing with reference to FIG. 1 used in a description of the first exemplary embodiment, after forming a lower layer metal film on the insulating substrate 1 of transparent substrate such as glass substrate first, it is patterned by the photolithography method, the etching method and the stripping method, and the gate pattern such as the gate electrode 2, the gate terminal 3 and the gate wiring 4 is formed (FIG. 1A and FIG. 1A-I through III).

Next, the gate insulation film 5, the semiconductor film 6 and the contact film 7 are formed entire surface of the insulating substrate 1 provided with the gate pattern. And here, without forming the upper layer metal film 8 on the substrate, the conductive ink material of Ag nanoparticle is used as the resist, and transfer-printed on the insulating substrate 1 by using the relief reversal offset printing, and then it is heated to evaporate the solvent or the like to provide the first resist pattern 9. (The conductive ink material means those materials having the conductivity are indicated at least after the TFT substrate has been completed, even if it does not necessarily have conductivity in the ink state.) And thereafter, the semiconductor film 6 is revealed by removing the exposed contact film 7 by the first etching with the first resist pattern as a mask. (FIG. 1C and FIGS. 1C-I through III. However, it is presumed that there are no upper layer metal films 8. Hereinafter, the same presumption is applied.)

And the second resist pattern 14 made of the novolac resin is transfer-printed on the insulating substrate 1 by the relief reversal offset printing, and heated (FIG. 1D and FIG. 1D-I through III).

Next, semiconductor film 6 is removed and the gate insulation film 5 is exposed to form the island pattern 15.

And the second resist pattern is removed from the insulating substrate by using a stripping solution including dimethyl sulfoxide and monoethanolamine or the like. At that time, the first resist pattern is not removed (FIG. 1E and FIG. 1E-I through III).

And a TFT substrate, an LCD panel and an LCD device will be completed by a similar method described in the first exemplary embodiment.

The present invention will be described in detail.

Development of resistance lowering technology of the wiring resistance develops with a high-definition of the LCD device and large screen in these days, pure Al or alloy material (hereinafter, just, to be called Al) is being the mainstream as the wiring material.

However, Al which is amphoteric metal possesses the feature that dissolves easily by acidity and basicity solution.

Therefore, in a manufacturing step of the TFT substrate, because solution such as TMAH used for development with the resist pattern is the basicity, a problem is that Al is easily dissolved.

When Al is used for one region (laminated film) or entire region (single layer film) of the data pattern by such a method described in the fifth conventional example among the third related art, Al of wiring will expose when substrate resist film is transformed by removing a thin portion of the resist film.

Therefore, a developing solution which can be used for substrate related art is further requested to have the function to prevent corrosive nature of Al, and thus there are also a lot of problems in case of implementation.

By such reason, although substrate developing solution having the anti-corrosion function that does not dissolve Al has been diligently processed in recent years, problems due to Al dissolution in the development can be totally solved according to the present invention.

The reason is that the development process is not needed when the first resist pattern and the second resist pattern are formed by using the transfer-printing of the present invention.

The method will be described, referring to FIG. 1 used in a description of the first exemplary embodiment.

First, the lower layer metal film is formed on the insulating substrate 1 of transparent substrate such as a glass substrate, it is patterned by the photolithography method, the etching method and a the stripping method, and the gate pattern such as the gate electrode 2, the gate terminal 3 and the gate wiring 4 is formed (FIG. 1A and FIG. 1A-I through III).

Next, the gate insulation film 5, the semiconductor film 6 and the contact film 7 are formed to cover the entire surface of the insulating substrate 1 provided with the gate pattern, and after that, as the upper layer metal film 8, the Al alloy film capable of an electric connection with an ITO film is formed thereon. As an example of Al alloy film enabling an electric connection with the ITO film is Al alloy material such as ACX (ver. 3) target made by Mitsui Mining & Smelting and Al—Ni system target made by Kobelco Research Institute.

The conductive ink material of ITO paste is transfer-printed on the insulating substrate 1 as a resist by using a relief reversal offset printing, and it is heated to form the first resist pattern 9 (FIG. 1B and FIG. 1B-I through III).

Next, by using the first resist pattern 9 as a mask, an upper layer metal film 8 is etched with mixed acid liquid including the phosphoric acid/nitric acid/acetic acid to form the data pattern (first time of the first etching). And then the exposed contact film 7 is removed by etching (second time of the first etching) to expose semiconductor film 6. (FIG. 1C and FIG. 1C-I through III are referred to, but it is presumed that there is no upper layer metal film 8. Hereinafter, the same presumption is applied.)

And the second resist pattern 14 consisting of novolac resin is transfer-printed on the insulating substrate 1 by using the relief reversal offset printing, and the insulating substrate 1 is heated (FIG. 1D and FIG. 1D-I through III).

Then, the semiconductor film 6 is removed to reveal the gate insulation film 5 by performing the second etching, and the island pattern 15 is formed.

And the above-mentioned resist pattern is removed from the insulating substrate 1 using a stripping solution consisting of dimethyl sulfoxide and monoethanolamine or the like. The resist removed here is only the second resist pattern (FIG. 1E and FIG. 1E-I through III).

And a TFT substrate, an LCD panel and an LCD device will be completed by a similar method described in the first exemplary embodiment.

Here, the second resist pattern that is arranged on the drain electrode, on the source electrode part and the channel portion neighboring the channel portion is not necessarily peeled.

By leaving the second resist pattern that is the ink material of insulating resin on the substrate without stripping it, those problems can be suppressed, that is, a deteriorated transistor characteristic owing to that ionic impurities or the like are pulled to a channel portion to become a fixed electric charge and influencing on it, and display unevenness or the like caused by charge-up due to friction between the channel portion and inner spacers. As an example of the ink material of insulating resin, other than the novolac resin, the acrylic resin, polyimide resin and those mixed resin or the like are also available.

Although an exemplary embodiment of the present invention has been described in detail above, these exemplary embodiments can be combined and carried out according to the need. A configuration in detail is not limited to this exemplary embodiment, and even if there is change or the like in the design in the range that does not deviate from a point of this invention, it is included in this invention.

The present invention can use a pattern formation method of an electronic component for a manufacturing method of TFT for LCD devices and also a production unit using the method of manufacturing TFT in particular.

In an electronic component of the present invention, the protruding length of the second resist pattern can be made to have two or more kinds of length.

In an electronic component of the present invention, those structures are available that the isolated pattern of the second resist pattern without overlapping the first resist pattern and/or the isolated pattern of the first resist pattern without overlapping the second resist pattern.

In an electronic component of the present invention, the first resist pattern can be made a configuration formed by a transfer-printing.

In a display device of the present invention, the second resist pattern covers at least part of the above-mentioned data wiring covered with the first resist pattern and is arranged so that it may stick out, and it can be made a configuration out of which the data wiring and the semiconductor film are formed into stair-like at a part which stuck out.

In a display device produced by the present invention, the gate pattern or the data pattern can be made a laminated film.

In a display device produced by the present invention, such structures are available that the display pixel region is surrounded by the second resist pattern between the display pixel region wherein the thin film transistor is formed and the frame seal area or the second resist pattern is included in the frame seal area.

In a display device produced by the present invention, an overlapping marker is formed by two isolated patterns such that one of the isolated patterns is the second resist pattern that does not overlap with the first resist pattern, and the other isolated pattern is the first resist pattern that does not overlap with the second resist pattern.

In a display device produced by the present invention, the first resist pattern includes an isolated pattern that does not overlap with the second resist pattern, and a marker for recognizing a product can be formed by the isolated pattern.

A display device produced by the present invention includes such a configuration that the first resist pattern includes an isolated pattern that does not overlap with the second resist pattern, and, an overlapping marker to be used in later step is formed by the isolated pattern.

In a display device produced by the present invention, after the second etching has been completed, the first resist pattern and the second resist pattern can be removed together.

In a display device produced by the present invention, after the second etching has been completed, the first resist pattern can be remained while the second resist pattern is removed, and the first resist pattern can be made conductive film for the data pattern is composed.

In a display device produced by the present invention, after the second etching has been completed, the first resist pattern and the second resist pattern can be made remain together, and the first resist pattern is a conductive film for the data pattern, and the second resist pattern can make it an insulating film arranged on the channel portion.

In a display device produced by the present invention, the second resist pattern material is organic resin material which can be mixed with the first resist pattern, and the material of the first and second resist patterns is either one of novolac resin, an acrylic resin and those mixed resin.

In a display device produced by the present invention, the first resist pattern material can be made of the conductive ink material. As an example of the conductive ink material, either one of gold nanoparticle ink, silver nanoparticle ink, nickel nanoparticle ink and ITO paste.

In a display device produced by the present invention, the first resist pattern material or the second resist pattern material can be made of such a configuration that is provided with the thermosetting property or the photocurability property.

In a display device produced by the present invention, it is possible to slightly etching the first resist pattern as a pretreatment prior to arranging the second resist pattern after the first etching is completed. This pretreatment includes either one of basicity solution processing, ashing processing by $O_2$ gas and UV lamp processing. The basicity solution includes either one of TMAH (Tetra Methyl Ammonium Hydroxide), amine system solution and hydroxylation alkali metal aqueous solution. The above-mentioned basicity chemical solution can be made of a configuration with which the surfactant material is mixed.

In a display device produced by the present invention, the first resist pattern may be exposed to vapor of HMDS prior to arranging the second resist pattern after the first etching is completed.

In a display device produced by the present invention, after arranging the second resist pattern, aftertreatment which removes floating sludge or the error pattern may be even performed before the second etching. This aftertreatment includes either one of basicity solution processing, ashing processing by $O_2$ gas and UV lamp processing. The basicity solution includes either one of TMAH, amine system solution and hydroxylation alkali metal aqueous solution.

In a display device produced by the present invention, it is desirable to form at least the second resist pattern by using either an offset printing or seal printing.

In a method of an offset printing of the present invention, it is preferable to have following features; three or more plate side alignment markers are arranged on a printing plate, and the plate side alignment markers are arranged outside the pattern part of a product; a substrate alignment apparatus and a plate alignment apparatus are arranged on the same position of the print substrate; as an alignment marker for determining the transfer-printing position of the second resist pattern, a substrate side alignment marker formed by the first resist pattern is used; and three or more substrate side alignment markers are arranged on a printing substrate, and the substrate side alignment markers are arranged outside the pattern part of a product.

In a display device produced by the present invention, it is desirable to make the surface moving speed of blanket approximately the same in the offset printing, that is, the surface moving speed of the blanket when forming a film of a resist on the blanket, the surface moving speed of the blanket when forming the pre-transfer resist pattern on the blanket, and the surface moving speed of the blanket when the second resist pattern is transfer-printed on the print substrate by contacting the pre-transfer resist pattern to the print substrate are made approximately equal.

In a display device produced by the present invention, it is desirable in the offset printing that those processing of the image pull-out and the transfer-printing are performed by the order of priority of following points from (1) to (3):

(1) In the case of that a transfer pattern includes a narrow pattern having less than 10 μm width, on the basis of the longest pattern among those narrow patters having no more than 10 μm width, the image pull-out and the transfer-printing are performed by arranging the image pull-out direction and the transfer-printing direction so as to be the same direction of the elongated direction of the longest pattern.

(2) In the case of that a transfer pattern does not include a pattern having no more than 10 μm width, on the basis of the longest pattern among those patters having no more than 30 μm width, the image pull-out and the transfer-printing are performed by arranging the image pull-out direction and the transfer-printing direction so as to be tilted at about 20 degrees from the direction of the elongated direction of the longest pattern.

(3) In the case of that a transfer pattern does not include a pattern having no more than 30 μm width, on the basis of the longest pattern regardless of its width size, the image pull-out and the transfer-printing are performed by arranging the image pull-out direction and the transfer-printing direction so as to be tilted at about 45 degrees from the direction of the elongated direction of the longest pattern.

In a display device produced by the present invention, it is desirable in the offset printing, to transfer-print the first resist pattern and the second resist pattern for the same direction toward the substrate, or to transfer-print the first resist pattern and the second resist pattern for the same direction toward the substrate and the same position of the blanket cylinder.

In a display device produced by the present invention, the offset printing is a relief reversal offset printing and such a configuration can be made that a plate side alignment marker is arranged on the print substrate by using the transfer-printing such that the marker is formed on a negative stamp with concave pattern.

An exemplary advantage according to the present invention, a high-quality pattern can be formed efficiently by arranging the second resist pattern on the first resist pattern by using a transfer-printing method so as to be overlapped with the part of the drain electrode and the source electrode provided with the first resist pattern and to cover a channel portion of the substrate which is provided with a data pattern and a contact film formed by the first etching with the first resist pattern as a mask, and after that removing the semiconductor film by performing the second etching.

An exemplary advantage according to the present invention is that the pattern can be formed by a facile method, because the resist pattern is formed by using a transfer-printing instead of a conventional photolithography method, those conventionally needed operations such as resist coating, exposure and development become unnecessary.

An exemplary advantage according to the present invention is that an LCD device of the high display quality that suppressed panel display unevenness can be produced by arranging the second resist pattern on the first resist pattern by using a transfer-printing method so as to be overlapped with the part of the drain electrode and the source electrode provided with the first resist pattern and to cover a channel portion of the substrate which is provided with a data pattern and a contact film formed by the first etching with the first resist pattern as a mask, and simultaneously arranging the second resist pattern which elongating so as to surround an LCD pixel region between the LCD pixel region and a frame seal region, and after that removing the semiconductor film by performing the second etching.

An exemplary advantage according to the present invention is that an LCD device of the high display quality that avoided a frame unevenness can be produced by arranging the second resist pattern on the first resist pattern by using a transfer-printing method so as to be overlapped with the part of the drain electrode and the source electrode provided with the first resist pattern and to cover a channel portion of the substrate which is provided with a data pattern and a contact film formed by the first etching with the first resist pattern as a mask, and simultaneously arranging the second resist pattern on a frame seal region, and after that removing the semiconductor film by performing the second etching.

An exemplary advantage according to the present invention is that the first isolated resist pattern part can be used not only as a product recognition marker but also as an overlapping marker with other steps. Those advantage can be produced by arranging the second resist pattern on the first resist pattern by using a transfer-printing method so as to be overlapped with the part of the drain electrode and the source electrode provided with the first resist pattern and to cover a channel portion of the substrate which is provided with a data pattern and a contact film formed by the first etching with the first resist pattern as a mask, and by providing the overlapped resist pattern and an isolated resist pattern on a substrate after the transfer-printing. The overlapped resist pattern is made by overlapping the first resist pattern and the second resist pattern on the channel portion, and the isolated resist pattern is a part of the first resist pattern which does not overlapped with the second resist pattern.

An exemplary advantage according to the present invention is that high superposition accuracy of the first resist pattern and the second resist pattern can be realized by overlapping these isolated resist pattern parts and using it as a marker. This advantage can be produced by arranging the second resist pattern on the first resist pattern by using a transfer-printing method so as to be overlapped with the part of the drain electrode and the source electrode provided with the first resist pattern and to cover a channel portion of the substrate which is provided with a data pattern and a contact film formed by the first etching with the first resist pattern as a mask, and simultaneously arranging an isolated second resist pattern which does not overlap with the first resist pattern, and thereby providing the overlapped resist pattern, an isolated portion of the second resist pattern and an isolated portion of the first resist pattern on the substrate after the transfer-printing. The overlapped resist pattern is made by overlapping the first resist pattern and the second resist pattern on the channel portion, and the isolated portion of the second resist pattern is a part of the second resist pattern which does not overlapped with the first resist pattern, and the isolated portion of the first resist pattern is a part of the first resist pattern which does not overlapped with the second resist pattern.

An exemplary advantage according to the present invention is that the edge shape of the pattern can be made forward tapered shape in stair-like by partially etching a single layer film or laminated layer film formed on a substrate with the first etching so as to remain part of the film by using the first resist pattern as a mask, and arranging the second resist pattern on the first resist pattern by using a transfer-printing method so as to be overlapped with the part of the first resist pattern and extended therefrom, and after that the remaining film is etched with the second etching.

An exemplary advantage according to the present invention is that the edge shape of the pattern can be made forward tapered shape in stair-like by etching an upper layer of the laminated layer film formed on a substrate with the first etching by using the first resist pattern as a mask, and arranging the second resist pattern on the first resist pattern by using a transfer-printing method so as to be overlapped with the part of the first resist pattern and extended therefrom, and after that a lower layer of the laminated layer film is etched with the second etching using a chemical solution which is different from the etchant used in the first etching.

An exemplary advantage according to the present invention is that the edge shape of the pattern can be made forward tapered shape in stair-like so as to have different length at flat portion (the length thereof includes the case of zero) by arranging the second resist pattern on the first resist pattern on a substrate, which is subjected to the first etching using the first resist pattern as a mask, by using a transfer-printing method so as to be overlapped with the part of the first resist pattern and extended therefrom with two or more different length, and after that the second etching is performed.

An exemplary advantage according to the present invention is that manufacturing step is simplified by employing the conductive ink material containing organic solvent as the first resist pattern material, because the resist pattern can be used as the metal for both data pattern and gate pattern.

An exemplary advantage according to the present invention is that the transistor characteristic can be improved by forming the data pattern using the conductive ink material containing organic solvent as the first resist pattern material, and arranging the second resist pattern with insulating material by transfer-printing, and completing the second etching, and after that, without stripping insulating material such that the channel portion is covered with the second resist pattern, and thereby easily protecting the channel portion with the insulating resin material that remains on the channel portion.

An exemplary advantage according to the present invention is that the pattern can be formed without etching defects by improving the adhesion between the second resist pattern and the first resist pattern and an exposed foundation film. The improvement of the adhesion can be made by subjecting the substrate to various treatments prior to arranging the second resist pattern thereon. The substrate surface can be treated with such treatment as removing a damaged layer of the first resist pattern, cleaning the substrate surface, and changing the whole surface of the substrate into the uniform surface condition instead of either the removing process or the cleaning process mentioned above, by using process such as basicity solution processing, ashing processing by $O_2$ gas, etching treatment with the first slight resist pattern by the UV lamp processing, surface-active agent processing, and exposure processing to HMDS (Hexamethyl Disilazane) vapor.

An exemplary advantage according to the present invention is that the pattern can be formed without etching defects by removing floating sludge on the substrate and the error pattern prior to etching but after transfer-printing the resist pattern, by using such treatment as basicity solution processing, ashing processing by $O_2$ gas and UV lamp processing.

An exemplary advantage according to the present invention is that the second resist pattern can be arranged accurately with its position by providing three or more plate side alignment markers on a negative stamp such that alignment can be performed about directions of an X-axis, a Y-axis and a θ-axis, while arranging the alignment marker outside the TFT pattern part to make the alignment deviation of the TFT patterns small when arranging the second resist pattern on the substrate.

An exemplary advantage according to the present invention is that the superposition accuracy of the first resist pattern and the second resist pattern can be confirmed with the substrate on which the second resist pattern was transfer-printed. This advantage can be made by providing a plate side alignment marker on a negative stamp with concave pattern to transfer-print it to the print substrate, and further arranging the installation position of the substrate alignment apparatus and the plate alignment apparatus to a print substrate about the same location, and thereby combining a substrate side alignment marker formed of the first resist pattern.

An exemplary advantage according to the present invention is that the second resist pattern can be overlapped with the first resist pattern with high location accuracy by using a substrate side alignment marker which is made of the first resist pattern as an alignment marker for determining the transfer-printing position of the second resist pattern.

An exemplary advantage according to the present invention is that the second resist pattern can be arranged accurately with its position by providing three or more substrate side alignment markers on a print substrate such that alignment can be performed about directions of an X-axis, a Y-axis and a θ-axis, while arranging the alignment marker outside the TFT pattern to make the alignment deviation of the TFT pattern small when arranging the second resist pattern on the substrate.

An exemplary advantage according to the present invention is that a stable transfer-printing is achieved on entire surface of the substrate. This advantage is obtained by making the surface moving speeds of blanket at each step approximately the same, that is, the surface moving speed of the blanket when forming a film of a resist on the blanket, the surface moving speed of the blanket when forming the pre-transfer resist pattern on the blanket, and the surface moving speed of the blanket when the second resist pattern is transfer-printed on the substrate by contacting the pre-transfer resist pattern to the print substrate are made approximately equal. Because of the same speed, the resist pattern on every position of the blanket exists there the same period and thus the solvent amount and the viscosity of the resist become equal, and thus the transfer-printing becomes stable.

An exemplary advantage according to the present invention is that a fine pattern can be printed by selecting following decision making items [1] to [3] with its order of priority for the direction of the image pull-out and transfer-printing.

[1] In the case of that a transfer pattern includes a narrow pattern having less than 10 μm width, on the basis of the longest pattern among those narrow patters having no more than 10 μm width, the image pull-out and the transfer-printing are performed by arranging the image pull-out direction and the transfer-printing direction so as to be the same direction of the elongated direction of the longest pattern.

[2] In the case of that a transfer pattern does not include a pattern having no more than 10 μm width, on the basis of the longest pattern among those patters having no more than 30 μm width, the image pull-out and the transfer-printing are performed by arranging the image pull-out direction and the transfer-printing direction so as to be tilted at about 20 degrees from the direction of the elongated direction of the longest pattern.

[3] In the case of that a transfer pattern does not include a pattern having no more than 30 μm width, on the basis of the longest pattern regardless of its width size, the image pull-out and the transfer-printing are performed by arranging the image pull-out direction and the transfer-printing direction so as to be tilted at about 45 degrees from the direction of the elongated direction of the longest pattern.

An exemplary advantage according to the present invention is that pattern formation can be performed in stability with handy management when the resist material to be transfer-printed on the substrate is not given the photosensitivity, because the material and a process parameter can be reduced compared with a case when photosensitive resin is used.

An exemplary advantage according to the present invention is that etching resistance can be improved by selecting the resist materials to be mingled and process condition such that resist material of the first resist pattern and resist material of the second resist pattern is mingled each other.

An exemplary advantage according to the present invention is that the superposition accuracy of the first resist pattern and the second resist pattern can be improved by transfer-printing the first resist pattern and the second resist pattern for the same direction toward the substrate using an offset printer, because the distortion of the pattern caused by direct advance or the like of the fixed frame can be ignored.

An exemplary advantage according to the present invention is that the superposition accuracy of the first resist pattern and the second resist pattern can be improved by transfer-printing the first resist pattern and the second resist pattern for the same direction toward the substrate using an offset printer and further by using the same position of the blanket cylinder, because the distortion of the pattern caused by the roundness or the like of the blanket cylinder in addition to that caused by the direct advance or the like of the fixed frame can be also ignored.

An exemplary advantage according to the present invention is that the superposition accuracy of the first resist pattern and the second resist pattern can be improved by transfer-printing the first resist pattern and the second resist pattern for the same direction toward the substrate using an offset printer and further by using the same position of the blanket cylinder and simultaneously using the same position of the same blanket, because the distortion of the pattern caused by the roundness or the like by thickness variation of the blanket in addition to those caused by the roundness or the like of the blanket cylinder and the direct advance or the like of the fixed frame can be also ignored.

According to the present invention, as described in the foregoing, the isolated first resist pattern and the second resist pattern, which could not be arranged by various technology described by the background art, can be easily arranged with high degree of freedom in the optional size, the optional shape, and the optional position, because the second resist pattern is arranged on a substrate by transfer-printing. Therefore, the pattern with high degree of freedom can be formed by efficiently combining formation and etching for the resist mask, and by using such pattern formation method, it is possible to provide an electronic component, particularly a display device produced by the high productivity and quality.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

What is claimed is:

1. A manufacturing method for an electronic component comprising:
   performing a first etching by using a first resist pattern as a first mask;
   transfer-printing a second resist pattern so as to overlap on at least one portion of said first resist pattern and to be extended therefrom after performing said first etching; and
   performing a second etching by using said first resist pattern and said second resist pattern as a second mask.

2. The manufacturing method for said electronic component according to claim 1, wherein said second resist pattern is transfer-printed so as to join two or more of said first resist pattern.

3. A manufacturing method for a display device by using a manufacturing method of a thin film transistor comprising:
   performing a first etching to a substrate provided with a gate pattern and films laminated thereon with an insulating film, a semiconductor film, a contact film and an upper layer metal film in that order to remove at least said upper layer metal film and said contact film by using a first resist pattern as a first mask and thereby forming a channel portion of said transistor and a data pattern including a drain electrode, source electrode, a data terminal and a data wiring;
   transfer-printing a second resist pattern at least on said first resist pattern located on both side portions of said channel portion and to cover said channel portion after performing said first etching; and
   performing a second etching by using said first resist pattern and said second resist pattern as a second mask to remove said semiconductor film for revealing said insulating film and thereby processing said semiconductor film into an island-shaped pattern.

4. The manufacturing method for said display device according to claim 3, wherein said second resist pattern is arranged so as to cover at least one portion of said data wiring and/or said data terminal and to be extended therefrom, and said second etching is performed to form a stair-like shape in a cross section of said data wiring and/or said data terminal and said semiconductor film.

5. The manufacturing method for said display device according to claim 3, wherein said second resist pattern is arranged to extend between a display pixel region of said thin film transistor and a frame seal area around said display pixel region so as to surround said display pixel region.

6. The manufacturing method for said display device according to claim 3, wherein said second resist pattern is formed in an frame seal area around a display pixel region of said thin film transistor.

7. The manufacturing method for said display device according to claim 3, wherein said second resist pattern includes a first isolated pattern that does not overlap with said first resist pattern, and said first resist pattern includes a second isolated pattern that does not overlap with said second resist pattern, and thereby forming a pair of overlapping markers with said first and second isolated patterns.

8. The manufacturing method for said display device according to claim 3, wherein said first resist pattern includes an isolated pattern that does not overlap with said second resist pattern, and a marker for recognizing a product is formed by said isolated pattern.

9. The manufacturing method for said display device according to claim 3, wherein said first resist pattern is remained on said thin film transistor while said second resist pattern is removed from said thin film transistor after said second etching is completed.

10. The manufacturing method for said display device according to claim 3, wherein said first resist pattern and said second resist pattern are remained together on said thin film transistor after said second etching is completed.

11. The manufacturing method for said display device according to claim 3, further comprising a step of performing aftertreatment which includes at least one of treatments of basicity solution treatment, ashing treatment by $O_2$ gas and UV lamp treatment.

12. The manufacturing method for said display device according to claim 3, wherein said first resist pattern is formed by using said transfer-printing.

13. The manufacturing method for said display device according to claim 3, wherein said transfer-printing includes offset printing or seal printing.

14. The manufacturing method for said display device according to claim 9, wherein said first resist pattern is a conductive film for composing at least a part of said data pattern.

15. The manufacturing method for said display device according to claim 10, wherein said first resist pattern is a conductive film for composing at least a part of said data pattern, and said second resist pattern is an insulating film arranged on said channel portion.

16. The manufacturing method for said display device according to claim 14, wherein said first resist pattern is conductive ink material 17. The manufacturing method for said display device according to claim 15, wherein said first resist pattern material is conductive ink material, and said second resist pattern material is ink material of insulating resin.

18. The manufacturing method for said display device according to claim 13, wherein said offset printing is performed such that a substrate side alignment marker formed by said first resist pattern is used as an alignment marker for determining a transfer-printed position of said second resist pattern.

19. The manufacturing method for said display device according to claim 13, wherein said offset printing is performed such that said first resist pattern and said second resist pattern are transfer-printed for a same direction toward to said substrate.

20. A manufacturing method for a display device by using a manufacturing method of a thin film transistor comprising:
   performing a first etching with a first resist pattern as a first mask to partially remove a film composing a data pattern;
   transfer-printing a second resist pattern at least to cover a portion of said first resist pattern and to be extended from said first resist pattern after performing said first etching; and
   performing a second etching by using said first resist pattern and said second resist pattern as a second mask to remove said film composing said data pattern and thereby making said data pattern to have a cross section of a stair-like shape.

* * * * *